(12) United States Patent
Mano

(10) Patent No.: US 10,298,111 B2
(45) Date of Patent: May 21, 2019

(54) PWM CONTROLLER, SWITCHED-MODE POWER SUPPLY, IMAGE FORMING APPARATUS, AND PWM CONTROL METHOD

(71) Applicant: Tsuyoshi Mano, Tokyo (JP)

(72) Inventor: Tsuyoshi Mano, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/996,662

(22) Filed: Jun. 4, 2018

(65) Prior Publication Data

US 2018/0367021 A1 Dec. 20, 2018

(30) Foreign Application Priority Data

Jun. 19, 2017 (JP) ................. 2017-119478

(51) Int. Cl.
*H02M 1/08* (2006.01)
*G03G 15/00* (2006.01)
*H03K 4/06* (2006.01)
*H02M 3/158* (2006.01)

(52) U.S. Cl.
CPC ............. *H02M 1/08* (2013.01); *G03G 15/80* (2013.01); *H02M 3/158* (2013.01); *H03K 4/06* (2013.01)

(58) Field of Classification Search
CPC .......... H02M 1/08; H02M 3/158; H03K 4/06; G03G 15/80
See application file for complete search history.

(56) References Cited

FOREIGN PATENT DOCUMENTS

JP 8-251930 9/1996

*Primary Examiner* — Emily P Pham
(74) *Attorney, Agent, or Firm* — Harness, Dickey & Pierce, P.L.C.

(57) ABSTRACT

A PWM controller includes a sine wave calculator to generate a sine wave signal according to a frequency command value, a first counter to generate a first triangular wave carrier signal, and a comparator to compare the sine wave signal with the first triangular wave carrier signal, generate a PWM signal, and supply the PWM signal to a power converter. The PWM controller further includes a second counter to generate a second triangular wave carrier signal that is π rad behind the first triangular wave carrier signal, a carrier number calculator to calculate a carrier number based on a multiplication number, and a carrier control unit to switch the first triangular wave carrier signal and the second triangular wave carrier signal based on the carrier number, to supply the triangular wave carrier signal to the comparator.

20 Claims, 16 Drawing Sheets

FIG. 16

| CASE | COMMAND FREQUENCY | CARRIER FREQUENCY | MULTIPLICATION NUMBER n | CARRIER NUMBER k | VOLTAGE DISTORTION | REFERENCE |
|---|---|---|---|---|---|---|
| 1 | 100 | 2000 | 20 | 5.00 | POSITIVE PEAK | FIG. 5 |
| 2 | 111 | 2000 | 18 | 4.50 | NEGATIVE PEAK | FIG. 6 |
| 3 | 105 | 2000 | 19 | 4.75 | NONE | FIG. 7 |
| 4 | 117 | 2000 | 17 | 4.25 | NONE | |

FIG. 17

| CASE | CARRIER NUMBER n | NO COUNTER CHANGE | SINE WAVE 0 TO π | SINE WAVE π TO 2π | FLAG |
|---|---|---|---|---|---|
| 1 | 5.00 | | COUNTER B | COUNTER A | F2 |
| 2 | 4.50 | | COUNTER A | COUNTER B | F3 |
| 3 | 4.75 | COUNTER A | | | F1 |
| 4 | 4.25 | COUNTER A | | | F1 |

FIG. 18

| FLAG | SINE WAVE 0 TO π | SINE WAVE π TO 2π |
|---|---|---|
| F1 | s0=0 | s0=0 |
| F2 | s0=1 | s0=0 |
| F3 | s0=0 | s0=1 |

PWM CONTROLLER, SWITCHED-MODE POWER SUPPLY, IMAGE FORMING APPARATUS, AND PWM CONTROL METHOD

CROSS-REFERENCE TO RELATED APPLICATION

This patent application is based on and claims priority pursuant to 35 U.S.C. § 119(a) to Japanese Patent Application No. 2017-119478, filed on Jun. 19, 2017, in the Japan Patent Office, the entire disclosure of which is hereby incorporated by reference herein.

BACKGROUND

Technical Field

Embodiments of the present disclosure relate to a pulse width modulation (PWM) controller, a switched-mode power supply, an image forming apparatus, and a PWM control method.

Related Art

In general, an image forming apparatus generates a high voltage by using a switched-mode power supply including a PWM controller and a power converter.

The PWM controller includes a sine wave calculator to generate a sine wave signal according to a frequency command value, a counter to generate a triangular wave carrier signal, and a comparator that compares the sine wave signal and the triangular wave carrier signal to generate and supply a PWM signal to the power converter.

SUMMARY

According to an embodiment of this disclosure, an improved PWM controller includes a sine wave calculator to generate a sine wave signal according to a frequency command value, a first counter to generate a first triangular wave carrier signal, and a comparator to compare the sine wave signal with the first triangular wave carrier signal, generate a PWM signal, and supply the PWM signal to a power converter. The PWM controller further includes a second counter to generate a second triangular wave carrier signal that is $\pi$ rad behind the first triangular wave carrier signal and a carrier number calculator to calculate a carrier number based on a multiplication number. The carrier number indicates the number of carrier signals of the first triangular wave generated in a period in which a phase angle of the sine wave signal ranges from 0 to $\pi/2$ rad or from 0 to $3\pi/2$ rad, and the multiplication number is a ratio of a frequency of the first triangular wave carrier signal to the frequency command value. The PWM controller yet further includes a carrier control unit to switch a triangular wave carrier signal to the first triangular wave carrier signal or the second triangular wave carrier signal based on the carrier number, to supply the triangular wave carrier signal to the comparator in a first range of the phase angle ranging from 0 to $\pi$ rad or a second range of the phase angle ranging from $\pi$ to $2\pi$ rad.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 16 is a table illustrating a relation between voltage distortion and the calculated result generated by the carrier number calculator illustrated in FIG. 8;

FIG. 17 is a table illustrating the processed result generated by a selection command generator illustrated in FIG. 8;

FIG. 18 is a table illustrating the processed result generated by a phase control unit illustrated in FIG. 8.

Figure 1:
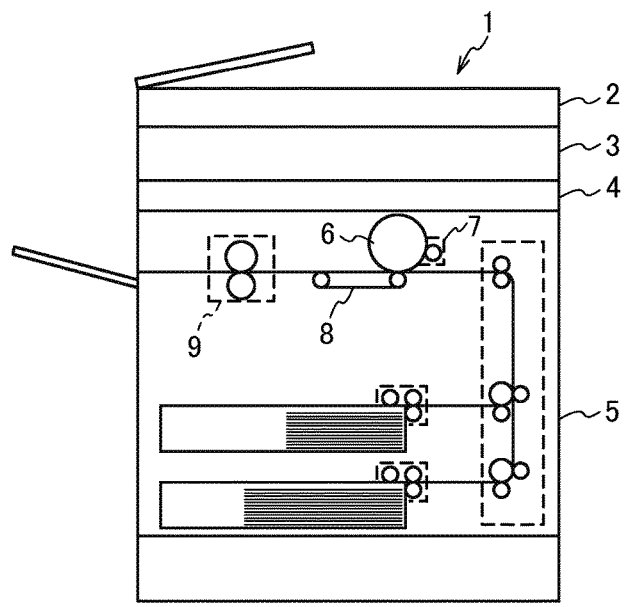
FIG. 1 is a schematic view of an image forming apparatus according to an embodiment of the present disclosure.

The accompanying drawings are intended to depict embodiments of the present disclosure and should not be interpreted to limit the scope thereof. The accompanying drawings are not to be considered as drawn to scale unless explicitly noted. In addition, identical or similar reference numerals designate identical or similar components throughout the several views.

DETAILED DESCRIPTION

In describing embodiments illustrated in the drawings, specific terminology is employed for the sake of clarity. However, the disclosure of this patent specification is not intended to be limited to the specific terminology so selected, and it is to be understood that each specific element includes all technical equivalents that have the same function, operate in a similar manner, and achieve a similar result.

As used herein, the singular forms "a", "an", and "the" are intended to include the plural forms as well, unless the context clearly indicates otherwise.

Embodiments of the present disclosure are described below with reference to the drawings.

First Embodiment

A description is given of operations of an image forming apparatus 1 in a copy mode, with reference to FIG. 1.

FIG. 1 is a schematic view of the image forming apparatus 1 according to a first embodiment of the present disclosure.

In the copy mode, an auto document feeder (ADF) 2 sequentially feeds a bundle of documents to an image reader 3 sheet by sheet, and the image reader 3 reads image data from each document.

Via an image processor, the image data read from the bundle of documents is converted to optical information by a writing unit 4, and a photoconductor 6 uniformly charged by a charger is exposed based on the optical information from the writing unit 4, thereby forming an electrostatic latent image.

Then, the developing device 7 develops the electrostatic latent image on the photoconductor 6 into a toner image. The toner image is then transferred onto a recording medium conveyed by a conveyance belt 8 and fixed thereon by a fixing device 9. Subsequently, the recording medium bearing the toner image is output from the image forming apparatus 1.

Figure 2:
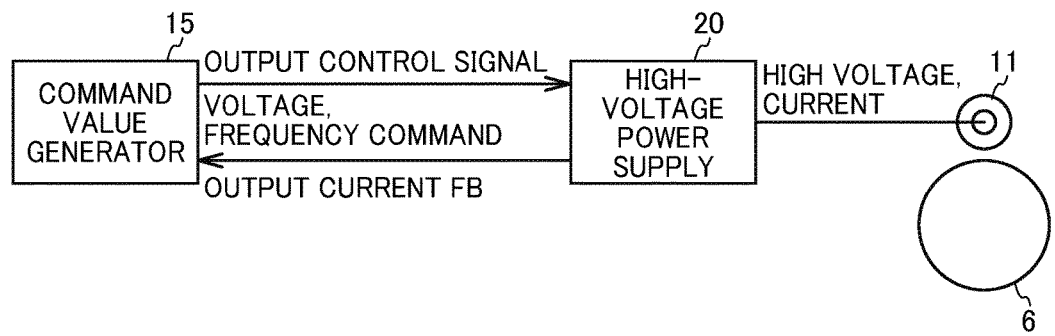
FIG. 2 is a schematic block diagram illustrating a relation between a charging roller and a high-voltage power supply for charging as a switched-mode power supply according to an embodiment of the present disclosure.

FIG. 2 is a schematic block diagram illustrating a relation between a charging roller 11 and a high-voltage power supply for charging 20 serving as a switched-mode power supply.

A command value generator 15 outputs a voltage command and a frequency command, which are output control signals, to the high-voltage power supply for charging 20, and accepts an output current feedback (FB) signal output from the high-voltage power supply for charging 20.

The high-voltage power supply for charging 20 generates and outputs a high voltage and a current to the charging roller 11 based on the voltage command and the frequency command input from the command value generator 15 and outputs the output current FB signal to the command value generator 15.

The charging roller 11 applies the high voltage and the current generated by the high-voltage power supply for charging 20 to the photoconductor 6 disposed opposite the charging roller 11 (the charger).

Figure 3:
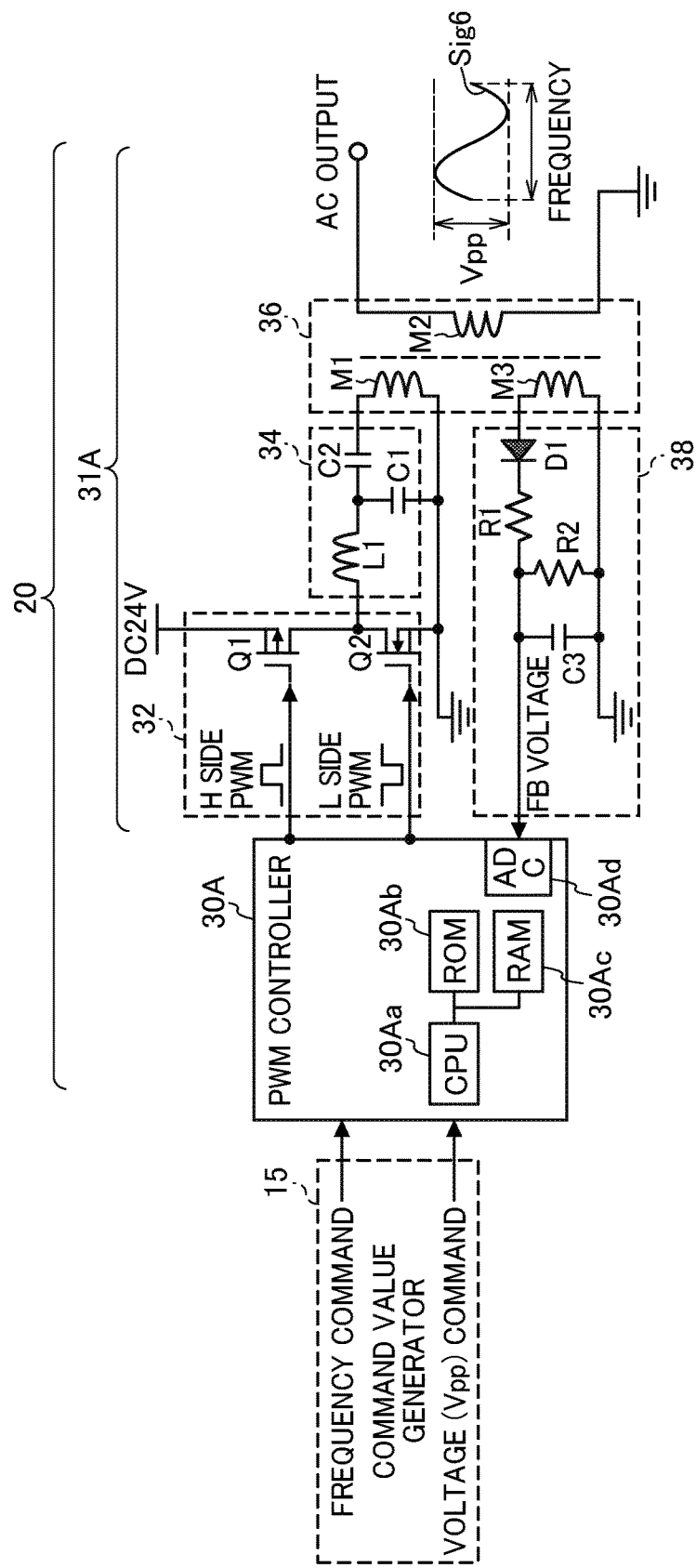
FIG. 3 is a circuit diagram of the configuration of a high-voltage power supply as a comparative switched-mode power supply.

FIG. 3 is a circuit diagram of the high-voltage power supply for charging 20 as a comparative switched-mode power supply.

A power converter 31A includes a pair of switching elements (transistors) Q1 and Q2 and a filter circuit 34 including a capacitor C2 for removing a direct current (DC) component between the pair of switching elements Q1 and Q2 and a primary coil M1 of a transformer 36.

The PWM controller 30A includes a central processing unit (CPU) 30Aa, a read only memory (ROM) 30Ab, a random access memory (RAM) 30Ac, and an analog to digital converter (ADC) 30Ad.

The CPU 30Aa reads an operating system (OS) from the ROM 30Ab, expands the OS on the RAM 30Ac, and boots up the OS. Then, under the management of the OS, the CPU reads a program (a processing module) of the application software from the ROM 30Ab and executes various processes.

It is to be noted that the PWM controller 30A may execute various types of processes using hardware such as a field-programmable gate array (FPGA) or the like, instead of software.

The PWM controller 30A accepts the frequency command and the voltage command from the command value generator 15 and the output current FB signal from the high-voltage power supply for charging 20, performs PWM control, and outputs the PWM signal to the power converter 31A.

The power converter 31A inputs the PWM signal supplied from the PWM controller 30A to a half bridge circuit 32, filters the signal in a sinusoidal manner by the filter circuit 34, removes DC components by the capacitor C2 for removing DC component, boosts the signal to the high voltage by the transformer 36, and outputs the sinusoidal high voltage.

The filter circuit 34 including the capacitor C2 for removing DC component minimizes the periodic fluctuation of the output sine wave voltage and equalizes the voltage of the positive peak portion with the voltage of the negative peak portion, thereby keeping the surface potential of the photoconductor 6 constant. Accordingly, DC components can be easily removed without special control.

Figure 4:
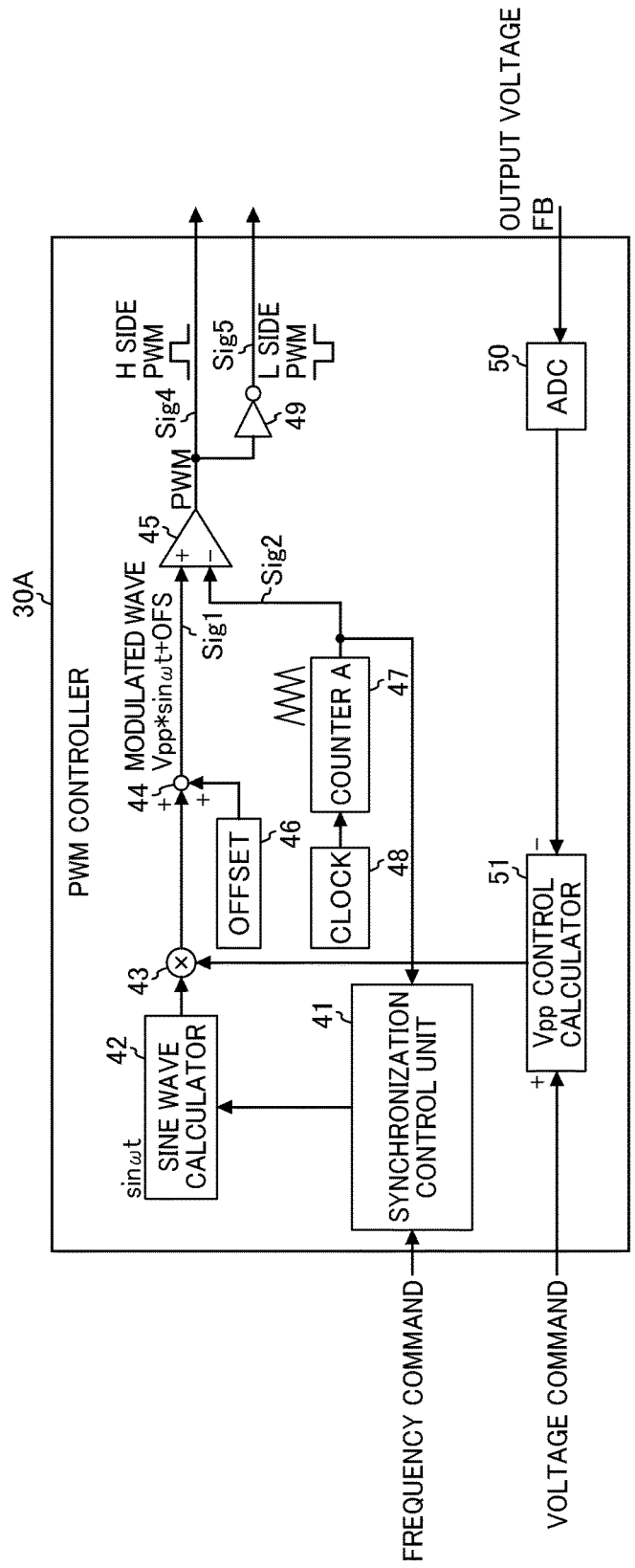
FIG. 4 is a block diagram of a comparative PWM controller in FIG. 3.

FIG. 4 is a block diagram of a comparative PWM controller 30A.

As described above, the comparative PWM controller 30A includes a microcomputer including, for example, the CPU 30Aa, the ROM 30Ab, and the RAM 30Ac. In addition, the comparative PWM controller 30A includes a synchronization control unit 41, a sine wave calculator 42, a multiplier 43, an adder 44, a comparator 45, an offset 46, a first counter A 47, a clock 48, and a Vpp control calculator 51 as the processing modules.

The synchronization control unit 41 calculates a multiplication number n that is an integer obtained by dividing the frequency fc by the frequency command value fs based on the frequency command value fs input from the command value generator 15 and the frequency fc of the carrier signal A of the first triangular wave input from the counter A 47 (the first counter). Then, the synchronization control unit 41 calculates an angular speed ω from the multiplication number n as expressed in equations below, and supplies the angular speed ω to the sine wave calculator 42, thereby synchronizing the first triangular wave carrier signal with the sine wave signal A.

The sine wave calculator 42 calculates a sine wave (sin ωt) according to the angular speed ω. As a result, it is possible to synchronize the carrier signal A output from the counter A 47 with the sine wave signal (sin ωt) output from the sine wave calculator 42.

$$n=fc/fs$$

$$fs=fc/n(\text{Hz})$$

$$\omega=2\pi fs=2\pi fc/n(\text{rad}/s)$$

The Vpp control calculator 51 accepts the voltage command from the command value generator 15 and performs Vpp control based on data digitally converted from the output voltage FB data by the ADC 50.

The multiplier 43 multiplies the sine wave signal sin ωt by Vpp control value, and the adder 44 adds the multiplied result to an output OFS from the offset 46, thereby generating a modulated wave y expressed by the following.

$$y=Vpp\times\sin \omega t+OFS$$

The counter A 47 counts pulses from the clock 48, generates a triangular wave carrier signal (a carrier wave), and outputs the triangular wave carrier signal to the comparator 45.

The comparator 45 compares the modulated wave y with the triangular wave carrier signal, generates the PWM signal, and outputs the PWM signal to the transistor Q1.

An inverter 49 inverts the PWM signal and outputs an inverted PWM signal to the transistor Q2.

Figure 5:
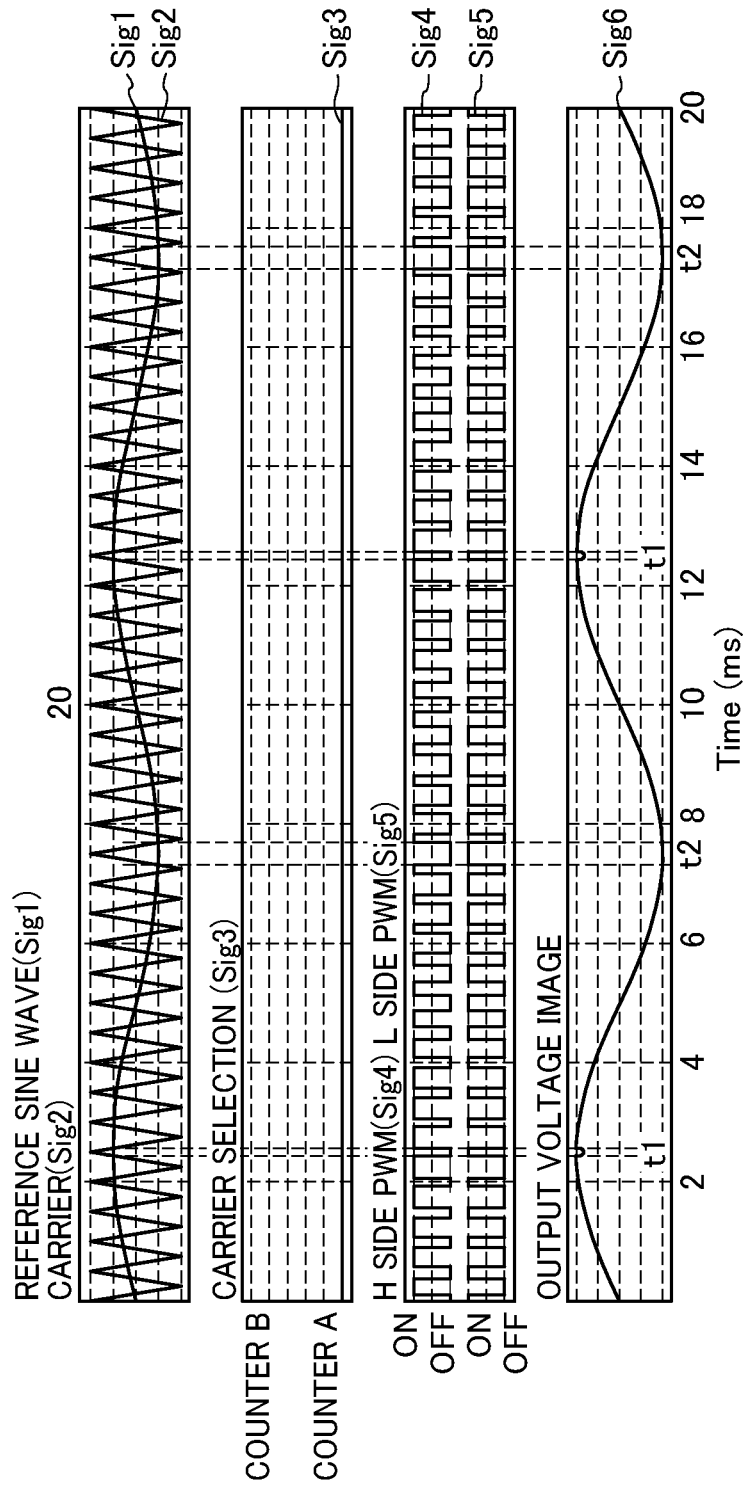
FIG. 5 is a timing chart illustrating an example of a phase relation between a carrier signal and a modulated wave when voltage distortion occurs in a positive peak portion in the comparative PWM controller in FIG. 4.

FIG. 5 is a timing chart illustrating an example (Case 1) of a phase relation between the carrier signal and the modulated wave when voltage distortion occurs in the positive peak portion in the comparative PWM controller 30A illustrated in FIG. 4.

As described above, the comparator 45 compares the modulated wave y (Sig1) with the triangular wave carrier signal (Sig2), generates the PWM signal, and output a high (H)-side PWM signal (Sig4) to the transistor Q1. The inverter 49 inverts the PWM signal and output a low (L)-side PWM signal (Sig5) to the transistor Q2.

At that time, as illustrated in FIG. 5, the H-side PWM signal (Sig4) in the positive peak portion is off in an interval t1, and an output voltage is decreased and distorted toward a decreasing direction.

On the other hand, as illustrated in FIG. 5, the L-side PWM signal (Sig5) in the negative peak portion is on in an interval t2, and the output voltage is not distorted.

That is, voltage distortion occurs only in the positive peak portion of the sine wave (Sig6) of the output voltage. Therefore, undesirably, the surface potential of the photoconductor 6 does not become constant.

Figure 6:
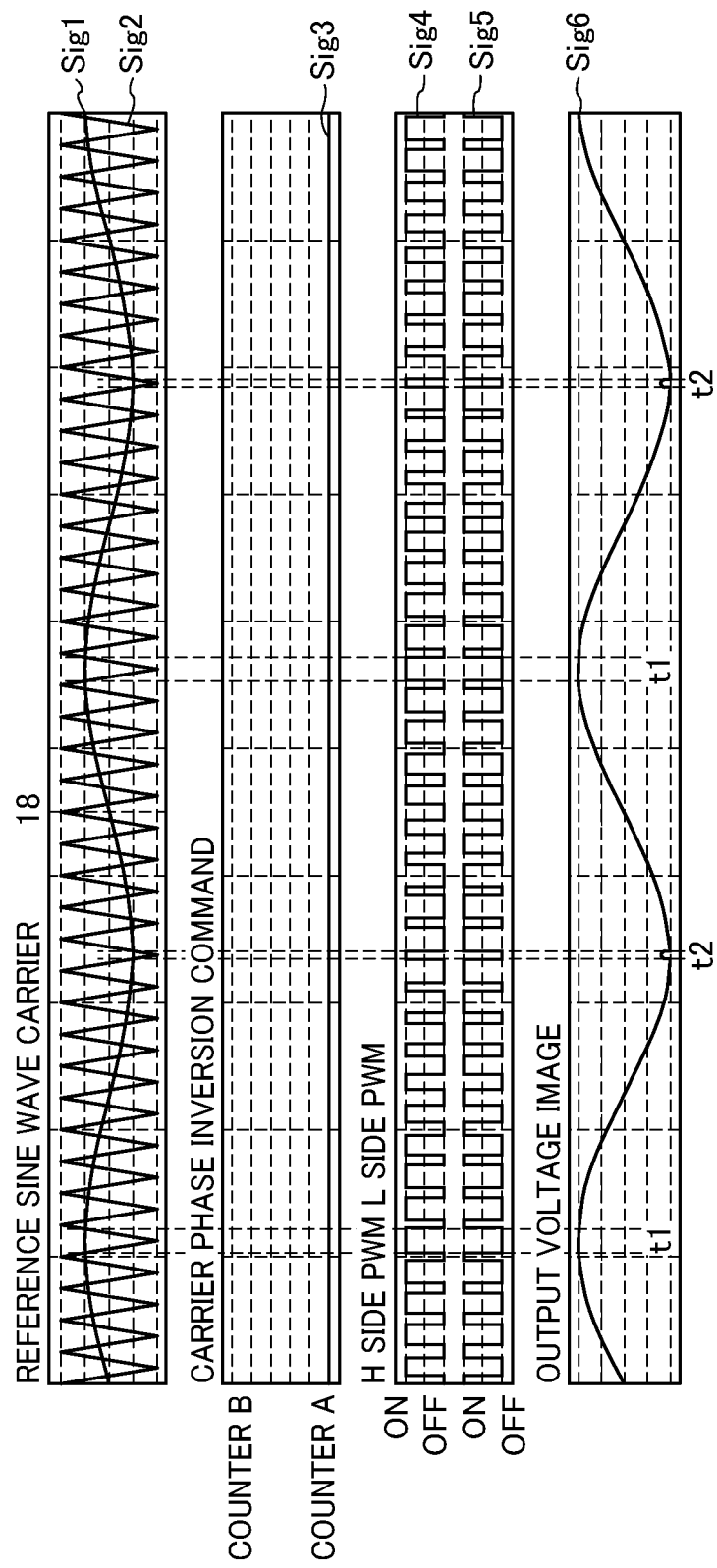
FIG. 6 is a timing chart illustrating an example of the phase relation between the carrier signal and the modulated wave when voltage distortion occurs in a negative peak portion in the comparative PWM controller in FIG. 4.

FIG. 6 is a timing chart illustrating an example (Case 2) of the phase relation between the carrier signal and the modulated wave when voltage distortion occurs in the negative peak portion in the comparative PWM controller 30A illustrated in FIG. 4.

As illustrated in FIG. 6, the phase of the H-side PWM signal in the positive peak portion is on in the interval t1, and the output voltage is not distorted.

However, as illustrated in FIG. 6, the phase of the L-side PWM signal in the negative peak portion is off in the interval t2, and the output voltage is decreased and distorted toward an increasing direction.

That is, voltage distortion occurs only in the negative peak portion of the sine wave of the output voltage. Therefore, the surface potential of the photoconductor 6 does not become constant.

Figure 7:
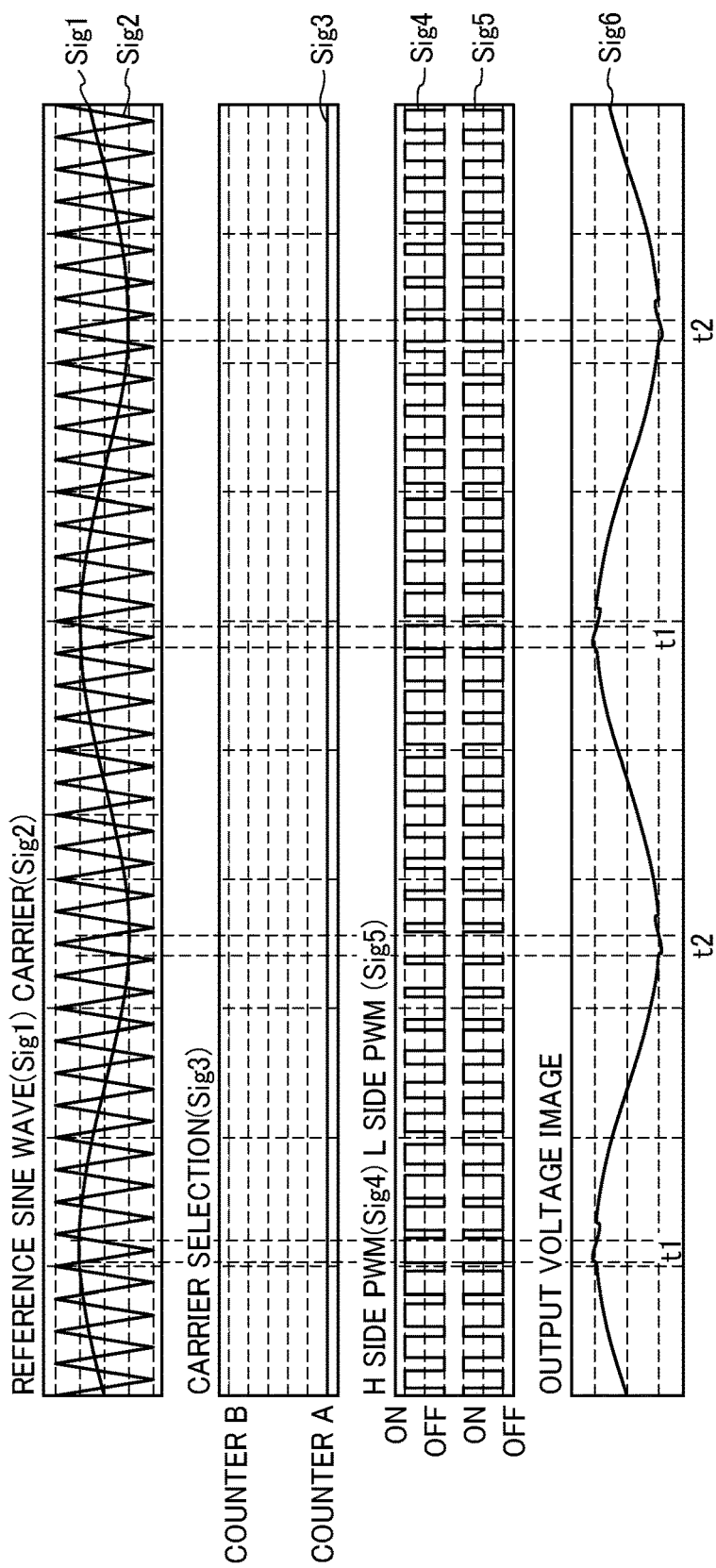
FIG. 7 is a timing chart illustrating an example of the phase relation between the carrier signal and the modulated wave when distortion occurs in both the positive peak portion and negative peak portion in the comparative PWM controller in FIG. 4.

FIG. 7 is a timing chart illustrating an example (Case 3) of the phase relation between the carrier signal and the modulated wave when voltage distortion occurs in both the positive peak portion and the negative peak portion in the comparative PWM controller 30A illustrated in FIG. 4.

As illustrated in FIG. 7, the phase of the H-side PWM signal in the positive peak portion is on in the interval t1, the phase of the L-side PWM signal in the negative peak portion is on in an interval t2.

That is, since the interval t1 is equal to the interval t2 in which the phase of the PWM signals in the positive peak portion and the negative peak portion are on, a potential difference between the positive peak portion and the negative peak portion is not generated, thereby keeping the surface potential of the photoconductor 6 constant.

Figure 8:
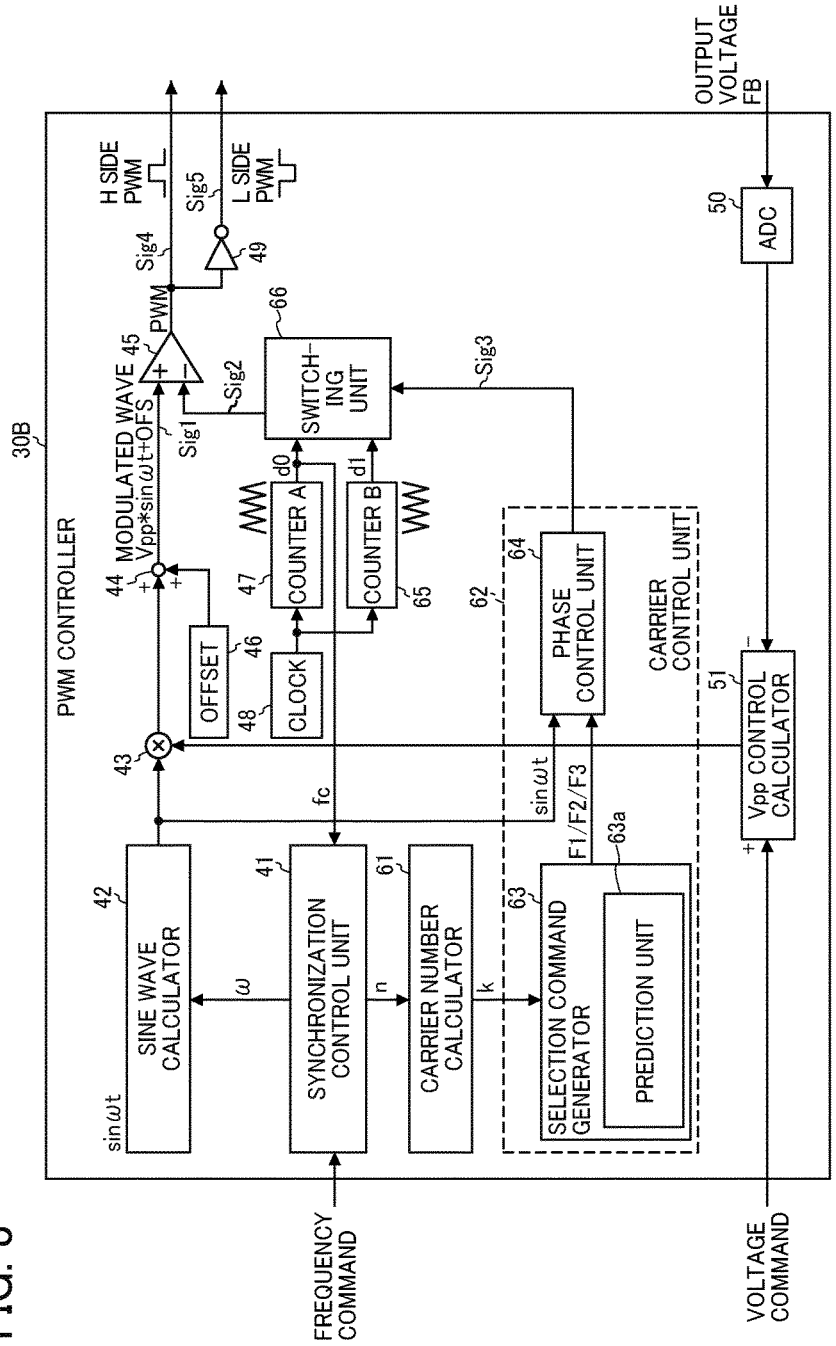
FIG. 8 is a block diagram of a PWM controller of an image forming apparatus according to a first embodiment of the present disclosure.

FIG. 8 is a block diagram of a PWM controller 30B used in the image forming apparatus 1 according to the first embodiment of the present disclosure.

In the image forming apparatus 1 according to the first embodiment of the present disclosure, the comparative PWM controller 30A illustrated in FIG. 3 is replaced by the PWM controller 30B illustrated in FIG. 8.

Similarly to the comparative PWM controller 30A described above, the PWM controller 30B includes the microcomputer including, for example, the CPU 30Aa, the ROM 30Ab, and the RAM 30Ac. In addition to the comparative PWM controller 30A, the PWM controller 30B further includes a carrier number calculator 61, a carrier control unit 62, a counter B 65, and a switching unit 66 as the processing modules.

The carrier number calculator 61 calculates the multiplication number n that is the integer obtained by dividing the frequency fc of the first triangular wave carrier signal by the frequency command value fs.

The carrier number calculator 61 calculates a carrier number k based on the multiplication number n that indicates a ratio of the frequency fc of the first triangular wave carrier signal to the frequency command value fs. The carrier number k indicates the number of carrier signals of the first triangular wave generated when a phase angle of the sine wave signal ranges from 0 to $\pi/2$ rad or from 0 to $3\pi/2$ rad.

Based on the carrier number k, the carrier control unit 62 switches the triangular wave carrier signal to the first triangular wave carrier signal or the second triangular wave carrier signal. The triangular wave carrier signal is supplied to the comparator 45 in a first range of the phase angle in which the phase angle of the sine wave signal is from 0 to $\pi$ rad or a second range of the phase angle in which the phase angle of the sine wave signal is from $\pi$ to $2\pi$ rad.

The carrier control unit 62 includes a selection command generator 63 and a phase control unit 64.

Based on the carrier number k, the selection command generator 63 generates at least one of a first selection command and a second selection command to avoid generation of voltage distortion in the positive peak portion or the negative peak portion of the sine wave voltage, which is generated by the power converter 31A according the phase of the PWM signal. The first selection command specifies the triangular wave carrier signal supplied to the comparator 45 in the first range of the phase angle from 0 to $\pi$ rad, and the second selection command specifies the triangular wave carrier signal supplied to the comparator 45 in the second range of the phase angle from $\pi$ to $2\pi$ rad.

The selection command generator 63 includes a prediction unit 63a to predict whether voltage distortion exists in the positive peak portion or the negative peak portion of the sine wave voltage generated by the power converter 31A according to the phase of the PWM signal based on the carrier number k. In a case in which the prediction unit 63a predicts that voltage distortion exists in the positive peak portion or the negative peak portion, the selection command generator 63 generates the first selection command or the second selection command to avoid generation of voltage distortion in the positive peak portion or the negative peak portion of the sine wave voltage, which is generated by the power converter 31A according the phase of the PWM signal.

In a case in which a first decimal place of the carrier number k is 0, the prediction unit 63a predicts that voltage distortion exists in the positive peak portion of the sine wave voltage generated by the power converter 31A according the phase of the PWM signal. In a case in which the first decimal place of the carrier number k is 5, the prediction unit 63a predicts that voltage distortion exists in the negative peak portion of the sine wave voltage generated by the power converter 31A according the phase of the PWM signal.

When the prediction unit 63a predicts that voltage distortion exists in the positive peak portion, the selection command generator 63 generates the second selection command to supply the second triangular wave carrier signal to the comparator 45 in the first range of the phase angle from 0 to π rad and the first selection command to supply the first triangular wave carrier signal to the comparator 45 in the second range of the phase angle from π to 2π rad.

On the other hand, when the prediction unit 63a predicts that voltage distortion exists in the negative peak portion, the selection command generator 63 generates the first selection command to supply the first triangular wave carrier signal to the comparator 45 in the first range of the phase angle from 0 to π rad and the second selection command to supply the second triangular wave carrier signal to the comparator 45 in the second range of the phase angle from π rad to 2π rad.

In a case in which the phase angle of the sine wave signal is in the first range of the phase angle from 0 to π rad, the phase control unit 64 generates a selection signal according to the first selection command. In a case in which the phase angle of the sine wave signal is in the second range of the phase angle from π to 2π rad, the phase control unit 64 generates the selection signal according to the second selection command.

The counter B 65 counts pulses from the clock 48 and outputs a count value B to the switching unit 66. It is to be noted that the phase angle of the count value B of the counter B65 is π rad (180°) ahead of the phase angle of the count value A of the counter A 47.

The switching unit 66 accepts a command by the phase control unit 64, switches the counter between the counter A 47 and the counter B 65, and outputs the optimum triangular wave carrier signal to the comparator 45 to avoid a distortion phase (the phase in which voltage distortion exists in either the positive peak portion or the negative peak portion).

Figure 9:
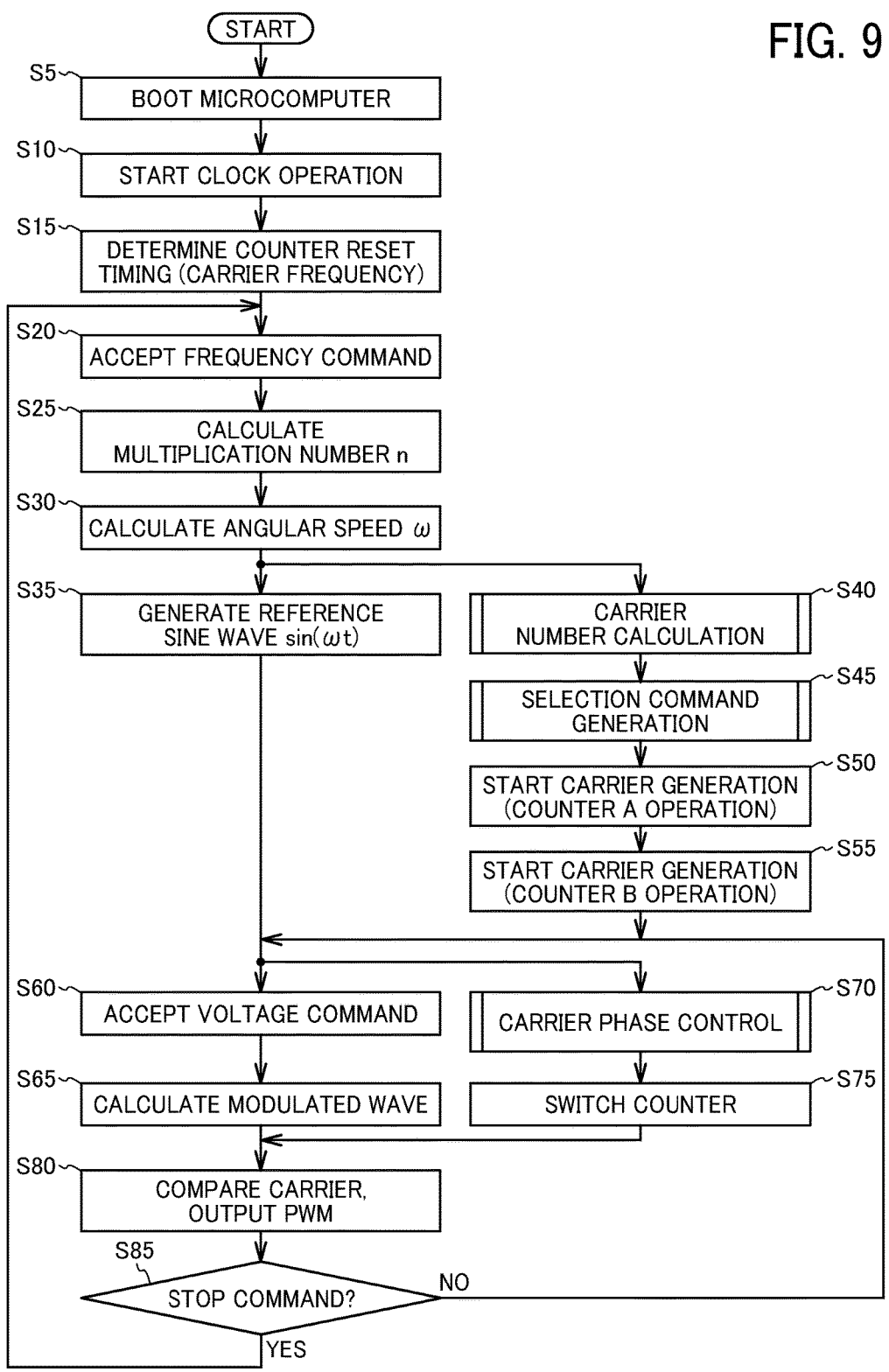
FIG. 9 is a flowchart illustrating operations performed by the PWM controller of the image forming apparatus according to the first embodiment.

FIG. 9 is a flowchart illustrating a control process from startup to normal operation of the PWM controller 30B in the image forming apparatus 1 according to the first embodiment.

In step S5, the PWM controller 30B boots up a microcomputer. At that time, as electric power is supplied to electronic components, the CPU 30Aa is reset, reads the operating system (OS) from the ROM 30Ab, expands the OS on the RAM 30Ac, and boots up the OS. Then, under the management of the OS, the CPU reads the program from the ROM 30Ab and executes various processes. A basic clock is input to the CPU 30Aa.

In step S10, the CPU 30Aa starts a clock operation. As the CPU 30Aa sets a desirable frequency division and operates the clock 48, the clock 48 outputs clock signals synchronizing with the basic clock.

In step S15, the CPU 30Aa determines a counter reset timing That is, the CPU 30Aa sets a carrier frequency.

In step S20, the CPU 30Aa accepts the frequency command value fs as the output control signal from the command value generator 15.

In step S25, the CPU 30Aa calculates the multiplication number n as expressed by the following equation. That is, the synchronization control unit 41 calculates the multiplication number n that is the integer obtained by dividing the frequency fc of the first triangular wave carrier signal by the frequency command value fs based on the frequency command value fs input from the command value generator 15 and the carrier signal fc of the first triangular wave input from the counter A 47 (the first counter).

$$n=fc/fs$$

In step S30, the CPU 30Aa calculates the angular speed ω. That is, the synchronization control unit 41 calculates the angular speed ω based on the multiplication number n and the carrier signal fc of the first triangular wave as expressed by the following equation.

$$fs=fc/n(\text{Hz})$$

$$\omega=2\pi fs=2\pi fc/n(\text{rad}/s)$$

In steps S35 and S40, parallel processing is executed.

In step S35, the CPU 30Aa generates the reference sine-wave signal sin ωt. That is, the sine wave calculator 42 calculates the sine-wave signal sin ωt according to the angular speed ω. As a result, it is possible to synchronize the carrier signal A output from the counter A 47 and the sine wave signal (sin ωt) output from the sine wave calculator 42.

Figure 12A:
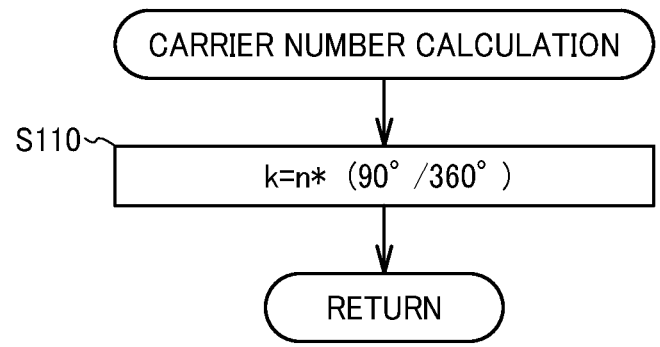
FIG. 12A is a flowchart of a carrier number calculation subroutine performed by a carrier number calculator illustrated in FIG. 8.

In step S40, the CPU 30Aa calls a carrier number calculation subroutine illustrated in FIG. 12A.

At that time, the carrier number calculator 61 calculates the multiplication number n that is the integer obtained by dividing the frequency fc of the first triangular wave carrier signal by the frequency command value fs.

Further, the carrier number calculator 61 calculates the carrier number k based on the multiplication number n that indicates the ratio of the frequency fc of the first triangular wave carrier signal to the frequency command value fs. The carrier number k indicates the number of carrier signals of the first triangular wave generated when the phase angle of the sine wave signal ranges from 0 to π/2 rad.

Alternatively, the carrier number calculator 61 can calculate the carrier number k, which indicates the number of carrier signals of the first triangular wave generated when the phase angle of the sine wave signal ranges from 0 rad to 3π/2 rad, based on the multiplication number n that indicates the ratio of the frequency fc of the first triangular wave carrier signal to the frequency command value fs.

FIG. 12A is a flowchart of the carrier number calculation subroutine (S40) illustrated in FIG. 8.

Next, processing of carrier number calculation is described in further detail below. The processing for cases (1) to (4) to be described later is executed in step S110 in the flowchart illustrated in FIG. 12A.

In Case 1 illustrated in FIGS. 5 and 16, the command frequency is 100 Hz, and the carrier frequency is 2000 Hz. Therefore, the multiplication number n of the carrier signal in one cycle of the modulated wave is obtained by dividing the carrier frequency by the command frequency, for example, as expressed as 2000/100=20. Accordingly, the carrier number k included in a period from 0 to π/2 rad (0° to 90°) is expressed as follows, $$k=20\times(90°/360°)=5.00.$$

In Case 2 illustrated in FIGS. 6 and 16, the command frequency is 111 Hz, and the carrier frequency is 2000 Hz. Therefore, the multiplication number n of the carrier signal in one cycle of the modulated wave is obtained by dividing the carrier frequency by the command frequency, for example, as expressed as 2000/111=18. Accordingly, the carrier number k included in the period from 0 to π/2 rad (0° to 90°) is expressed as follows, $$k=18\times(90°/360°)=4.50.$$

In Case 3 illustrated in FIGS. 7 and 16, the command frequency is 105 Hz, and the carrier frequency is 2000 Hz. Therefore, the multiplication number n of the carrier signal in one cycle of the modulated wave is expressed as 2000/105=19. Accordingly, the carrier number k included in the period from 0 to π/2 rad (0° to 90°) is expressed as follows, $$k=19\times(90°/360°)=4.75.$$

Furthermore, in Case 4 illustrated in FIG. 16, the command frequency is 117 Hz, and the carrier frequency is 2000 Hz. Therefore, the multiplication number n of the carrier signal in one cycle of the modulated wave is expressed as 2000/117=17. Accordingly, the carrier number k included in the period from 0 to π/2 rad (0° to 90°) is expressed as follows, $$k=17\times(90°/360°)=4.25.$$

In that time, similarly to above described example, since the interval t1 is equal to the interval t2 in the phase of PWM signals, a potential difference between the positive peak portion and the negative peak portion is not generated, thereby keeping the surface potential of the photoconductor 6 constant.

That is, the carrier number calculator 61 calculates the carrier number k based on the multiplication number n (integral multiple) obtained by dividing the carrier frequency by the command frequency.

FIG. 16 is a table illustrating a relation between voltage distortion and the calculated result generated by the carrier number calculator 61 illustrated in FIG. 8. The command frequency, the carrier frequency, multiplication number n, the carrier number k, voltage distortion, and reference number of the drawing for each case are illustrated.

In Cases 1 and 2, values below the decimal place of the carrier numbers k are "0.00" and "0.50", and voltage outputs in the positive peak portion and the negative peak portion are distorted as illustrated in FIGS. 5 and 6, respectively.

In Cases 3 and 4, values below the decimal place of the carrier numbers k are "0.75" and "0.25", and the voltage outputs are not distorted as illustrated in FIG. 7 and the like.

Figure 12B:
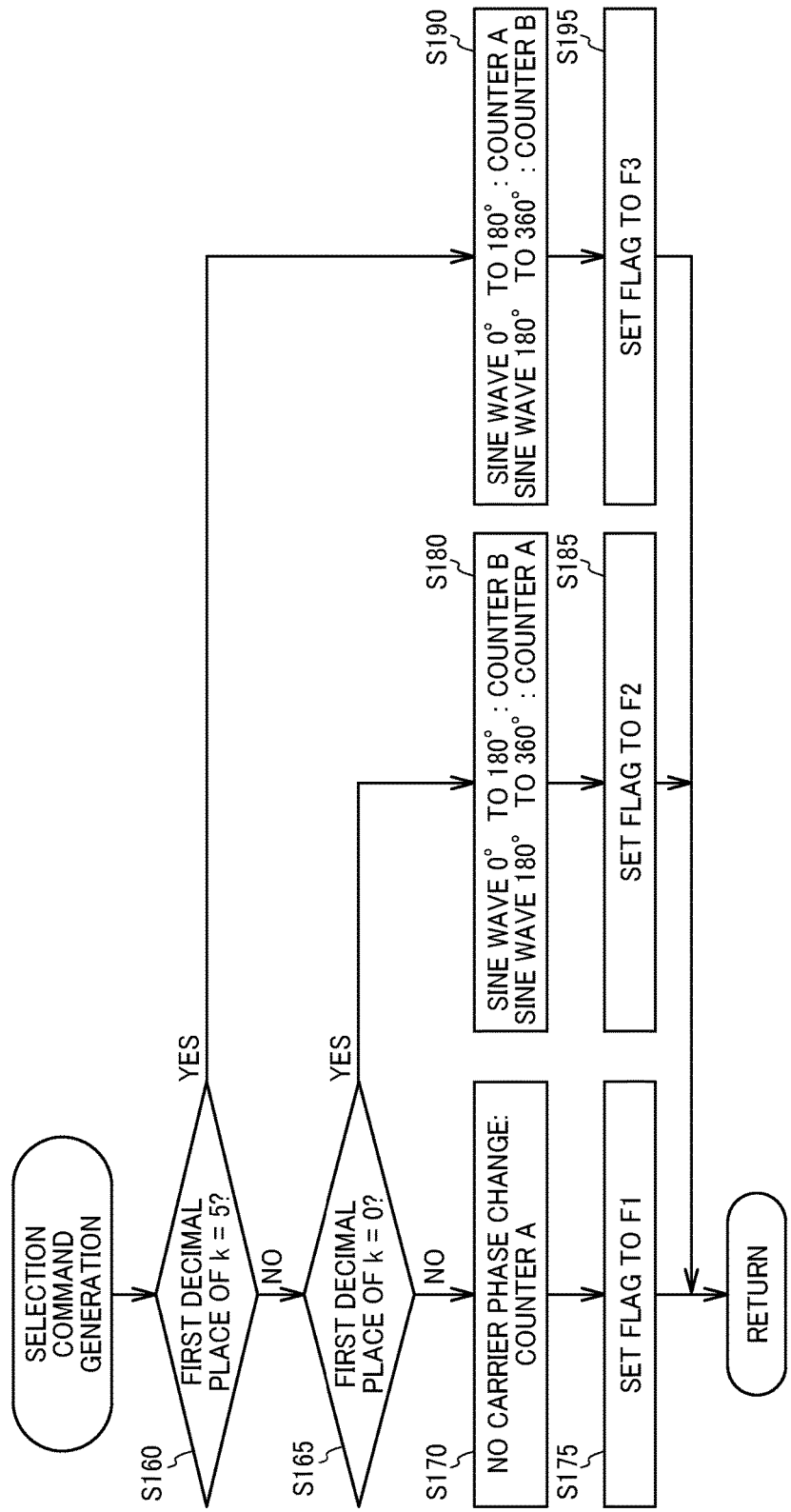
FIG. 12B is a flowchart of a selection command generation subroutine performed by a selection command generator illustrated in FIG. 8.

In step S45, the CPU 30Aa calls a selection command generation subroutine illustrated in FIG. 12B.

Based on the carrier number k, the selection command generator 63 generates at least one of the first selection command and the second selection command so that voltage distortion in the positive peak portion or the negative peak portion of the sine wave voltage, which is generated by the power converter 31A according the phase of the PWM signal, is not generated. The first selection command specifies the triangular wave carrier signal supplied to the comparator 45 in the first range of the phase angle from 0 to π rad, and the second selection command specifies the triangular wave carrier signal supplied to the comparator 45 in the second range of the phase angle from π to 2π rad.

The selection command generator 63 includes the prediction unit 63a to predict whether voltage distortion exists in the positive peak portion or the negative peak portion of the sine wave voltage generated by the power converter 31A according the phase of the PWM signal based on the carrier number k. In a case in which the prediction unit 63a predicts that voltage distortion exists in the positive peak portion or the negative peak portion, the selection command generator 63 generates the first selection command or the second selection command so that voltage distortion in the positive peak portion or the negative peak portion of the sine wave voltage, which is generated by the power converter 31A according the phase of the PWM signal, is not generated.

FIG. 12B is a flowchart of the selection command generation subroutine performed by the selection command generator 63 illustrated in FIG. 8.

In a step S160, the selection command generator 63 determines whether the carrier number k=xx.5, where xx means an integral part of the carrier number k, for example, xx=4 in Case 2. That is, the selection command generator 63 determines whether the first decimal place of the carrier number k calculated by the carrier number calculator 61 is 5.

In a step S165, the selection command generator 63 determines whether the carrier number k=xx.0. That is, the selection command generator 63 determines whether the first decimal place of the carrier number k is 0.

In a case in which the first decimal place of the carrier number k is 2 or 7 (except that the first decimal place of the carrier number k is 5 or 0), the selection command generator 63 determines there is no need to switch the carrier phase in step S170. That is, the selection command generator 63 selects the carrier signal A generated by the counter A.

In step S175, the selection command generator 63 set a flag to F1, and the process returns to main routine.

In a case in which the first decimal place of the carrier number k is 0, the selection command generator 63 selects the selection command of the counter B 65 to select the carrier signal B generated by the counter B 65 in the period in which the sine wave signal is within 0° to 180° and selects the selection command of the counter A 47 to select the carrier signal A generated by the counter A 47 in the period in which the sine wave signal is within 180° to 360° in step S180.

In step S185, the selection command generator 63 sets the flag to F2, and the process returns to the main routine.

In a case in which the first decimal place of the carrier number k is 5, the selection command generator 63 selects the selection command of the counter A 47 to select the carrier signal A generated by the counter A 47 in the period in which the sine wave signal is within 0° to 180° and selects the selection command of the counter B 65 to select the carrier signal B generated by the counter B 65 in the period in which the sine wave signal is within 180° to 360° in step S190.

In step S185, the selection command generator 63 set the flag to F3, and the process returns to the main routine.

FIG. 17 is a table illustrating the processed result performed by the selection command generator 63 illustrated in FIG. 8. The carrier number k, the selected counter in a case of no counter change, sine wave signal 0 to π rad (0° to 180°), or sine wave signal π to 2π rad (180° to 360°), and the flag for each case are illustrated.

In Case 1, when the carrier number k is 5.00, the selection command generator 63 selects counter B 65 in the period from 0 to π rad (0° to 180°) and selects counter A 47 in the period from π to 2π rad (180° to 360°).

In Case 2, when the carrier number k is 4.50, the selection command generator 63 selects counter A 47 in the period from 0 to π rad (0° to 180°) and selects counter B 65 in the period from π to 2π rad (180° to 360°).

In Case 3, when the carrier number is 4.75, there is no counter change, and the selection command generator 63 selects counter A 47 in the period from 0 to 2π rad (0° to 360°).

In Case 4, when the carrier number is 4.25, there is no counter change, and the selection command generator 63 selects counter A 47 in the period from 0 to 2π rad (0° to 360°).

In step S50, the CPU 30Aa executes carrier generation (counter A operation). The counter A 47 counts pulses from the clock 48, generates the triangular wave carrier signal (carrier wave), and outputs the carrier signal to the switching unit 66.

In step S55, the CPU 30Aa executes carrier generation (counter B operation). The counter B 65 counts pulses from the clock 48 and outputs the count value B to the switching unit 66. Note that the phase angle of the count value B of the counter B 65 is π rad (180°) ahead of the phase angle of the count value A of the counter A 47.

In steps S60 and S70, the parallel processing is executed.

In step S60, the CPU 30Aa accepts the voltage command as the output control signal from the command value generator 15. That is, the Vpp control calculator 51 accepts the voltage command from the command value generator 15, calculates the Vpp control value based on data digitally converted from the output voltage FB data by the ADC 50, and supplies the Vpp control value to the multiplier 43.

In step S65, the CPU 30Aa executes a modulated wave calculation. The multiplier 43 multiplies the sine wave signal sin ωt by the Vpp control value, the adder 44 adds the multiplied result to the output OFS from the offset 46, thereby generating the modulated wave y expressed by the following equation.

$$y = Vpp \times \sin \omega t + OFS$$

Figure 13:
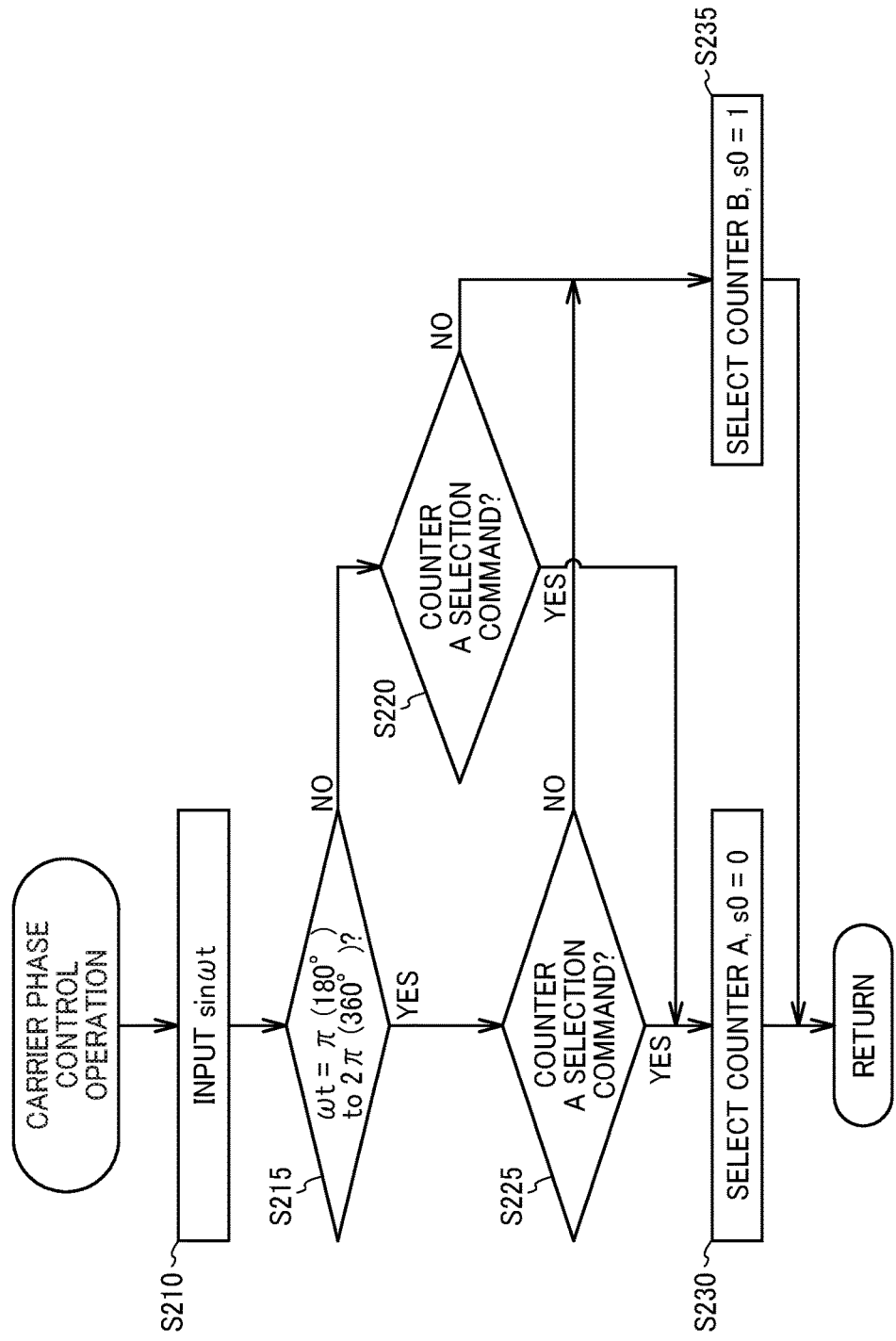
FIG. 13 is a flowchart of a carrier phase control subroutine performed by a phase control unit illustrated in FIG. 8.

In step S70, the CPU 30Aa calls a carrier phase control subroutine illustrated in FIG. 13.

In a case in which the phase angle of the sine wave signal is in the first range of the phase angle from 0 to π rad, the phase control unit 64 generates the selection signal according to the first selection command. In a case in which the phase angle of the sine wave signal is in the second range of the phase angle from π to 2π rad, the phase control unit 64 generates the selection signal according to the second selection command.

FIG. 13 is a flowchart of the carrier phase control subroutine performed by the phase control unit 64 illustrated in FIG. 8.

The phase control unit 64 monitors the phase of the angular speed (wt) of the sine wave signal and controls the counter switching performed by the switching unit 66 according to the counter selection command specified by the flag input from the selection command generator 63.

In step S210, the phase control unit 64 accepts the sine wave signal sin ωt generated by the sine wave calculator 42.

In step S215, the phase control unit 64 determines whether the phase of the angular speed (ωt) of the sine wave signal sin ωt is in the period from π to 2π (i.e., from 180° to 360°).

In that time, if the phase of the angular speed (ωt) is in the period from π to 2π, the process proceeds to step S225. On the other hand, if the phase of the angular speed (ωt) is not in the period from π to 2π (i.e., ωt is within 0 to π), the process proceeds to step S220.

When the phase of the angular speed (ωt) is in the period from 0 to π (from 0° to) 180°, the phase control unit 64 determines whether the phase control unit 64 has accepted the counter A selection command according to the flag input from the selection command generator 63 in step S220.

On the other hand, when the phase of the phase of the angular speed (ωt) is in the period from π to 2π (from 180° to 360°), the phase control unit 64 determines whether the phase control unit 64 has accepted the counter A selection command according to the flag input from the selection command generator 63 in step S225.

If the phase control unit 64 has accepted the counter A selection command according to the flag, in step S230, the phase control unit 64 sets a switching signal s0 (Sig3) to 0 in order to select the carrier output from the counter A.

On the other hand, if the phase control unit 64 has accepted the counter B selection command, in step S235, the phase control unit 64 sets the switching signal s0 (Sig3) to 1 in order to select the counter B.

FIG. 18 is a table illustrating the processed result generated by the phase control unit 64 illustrated in FIG. 8. The switching signals s0 (Sig3) of the sine wave signal (0° to 180°) and the sine wave signal (180° to 360°) for each flag are illustrated.

The phase control unit 64 outputs the switching signal s0 (Sig3) to the switching unit 66 according to the range of the angular speed of the sine wave signal. The switching unit 66 accepts the carrier signal A from the counter A 47 and the carrier signal B from the counter B 65 together. Then, the switching unit 66 outputs the selected carrier signal to the comparator 45 according to the switching signal s0 input from phase control unit 64.

In step S75, the CPU 30Aa executes counter switching operation. The switching unit 66 accepts the command by the phase control unit 64, switches between the counter A 47 and the counter B 65, and output the optimum triangular wave carrier signal to the comparator 45 to avoid the distortion phase (the phase in which voltage distortion exists in the positive peak portion or the negative peak portion).

In step S80, the CPU 30Aa executes carrier comparison and PWM signal output operation. That is, the comparator 45 compares the modulated wave y with the triangular wave carrier signal, generates the PWM signal, and outputs the PWM signal to the transistor Q1. The inverter 49 inverts the PWM signal and outputs the inverted PWM signal to the transistor Q2.

According to above described process, the power converter 31A inputs the PWM signal supplied from the PWM controller 30B to the half bridge circuit 32 and generates a power pulse signal including a sinusoidal envelop according to the PWM signal in the half bridge circuit 32. Then, the power converter 31A filters the power pulse signal in a sinusoidal manner by the filter circuit 34, removes DC components by the capacitor C2 for removing DC component, boosts the signal to a high voltage by the transformer 36, and outputs a sinusoidal high voltage.

In step S85, the CPU 30Aa determines whether the CPU 30Aa has accepted a stop command as the output control signal from the command value generator 15. If the CPU 30Aa has accepted the stop command, the process proceeds to step S20. On the other hand, if the CPU 30Aa has not accepted the stop command, the process proceeds to steps S60 and S70.

Figure 10A:
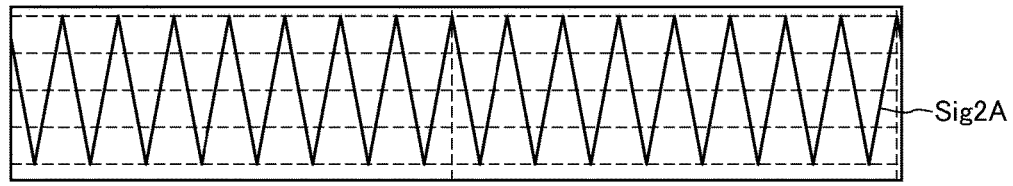
FIGS. 10A and 10B are sequence diagrams illustrating operations of a counter A and a counter B illustrated in FIG. 8.
Figure 10B:
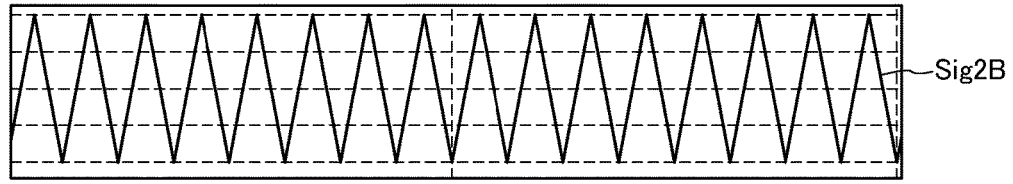

FIGS. 10A and 10B are sequence diagrams illustrating operations of the counter A 47 and the counter B 65 illustrated in FIG. 8.

The phase difference between the counter A 47 and the counter B 65 is π rad (180°).

The phase angle of the count value B (Sig2B) of the counter B 65 is π rad (180°) ahead of the phase angle of the count value A (Sig2A) of the counter A 47.

Figure 11:
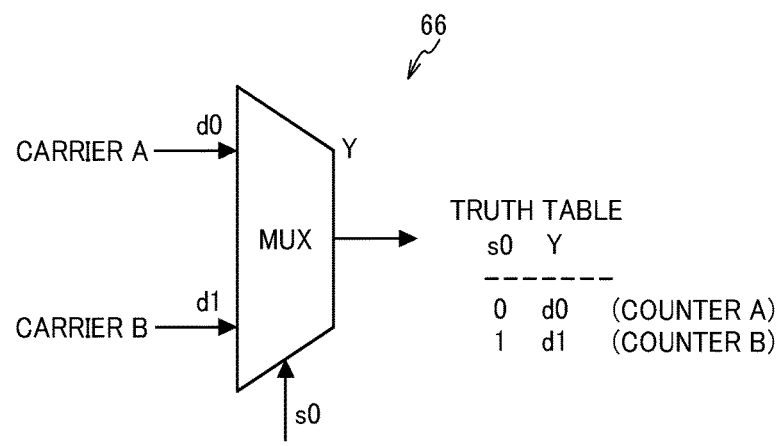
FIG. 11 is a circuit diagram of a specific example of the switching unit illustrated in FIG. 8.

FIG. 11 is a circuit diagram of an example of the switching unit 66 illustrated in FIG. 8.

The switching unit 66 accepts the carrier signal A as an input data d0 from the counter A 47 and the carrier signal B as input data dl from the counter B 65. The switching unit 66 includes a multiplexer (MUX) to switch an output data to the input data d0 or the input data dl according to the selection signal s0. If the selection signal s0 (Sig3) from the phase control unit 64 illustrated in FIG. 5 is 0, the switching unit 66 outputs the signal of the counter A 47. Alternatively, if the selection signal s0 (Sig3) from the phase control unit 64 is 1, the switching unit 66 outputs the signal of the counter B 65 to the comparator 45.

Figure 14:
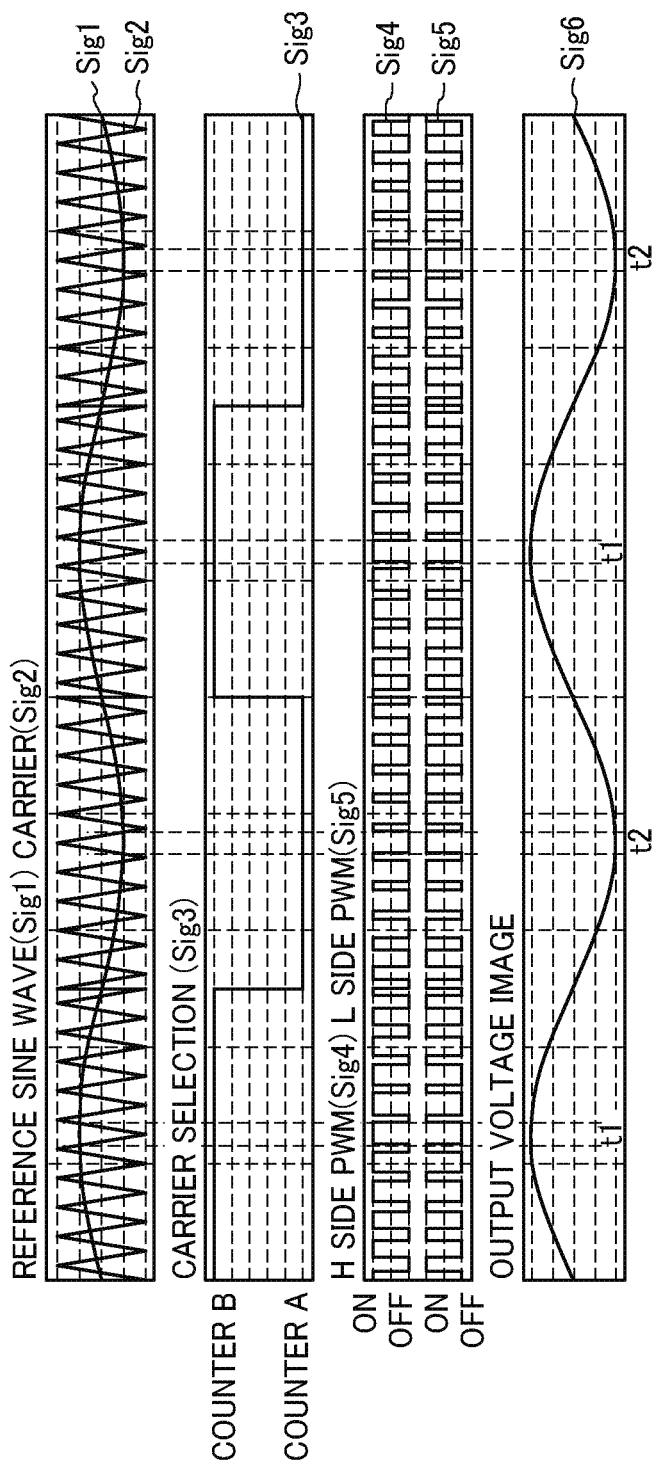
FIG. 14 is a timing chart illustrating an example of the phase relation between the carrier signal and the modulated wave when voltage distortion is eliminated in the positive peak portion by the PWM controller according to the first embodiment.

FIG. 14 is a timing chart illustrating an example of the phase relation between the carrier signal and the modulated wave when voltage distortion is eliminated in the positive peak portion by the PWM controller 30B.

In FIG. 14, voltage distortion in the positive peak portion is eliminated by performing the control illustrated in FIGS. 8 and 9.

In this case, the command frequency is 100 Hz, and the carrier frequency is 2000 Hz. Therefore, the multiplication number n of the carrier signal in one cycle of the modulated wave is expressed as 2000/100=20. Accordingly, the carrier number k at the phase angle of 90° is expressed as follows, $$k=20\times(90°/360°)=5.00.$$

As illustrated in FIG. 14, the switching phase at the phase angle of 90° is predicted and the switching unit 66 illustrated in FIG. 11 is operated to perform switching between the counter A 47 and the counter B 65 illustrated in FIGS. 10A and 10B based on conditions illustrated in FIG. 12B. Therefore, the carrier signal can be switched according to the phase of the sine wave (Sig1), and the ON times t1 and t2 in the positive peak portion and the negative peak portion of the output sine wave (Sig6) illustrated in FIG. 14 are identical (t1=t2).

Accordingly, the surface potential of the photoconductor 6 can be kept constant, and abnormal images can be prevented.

Figure 15:
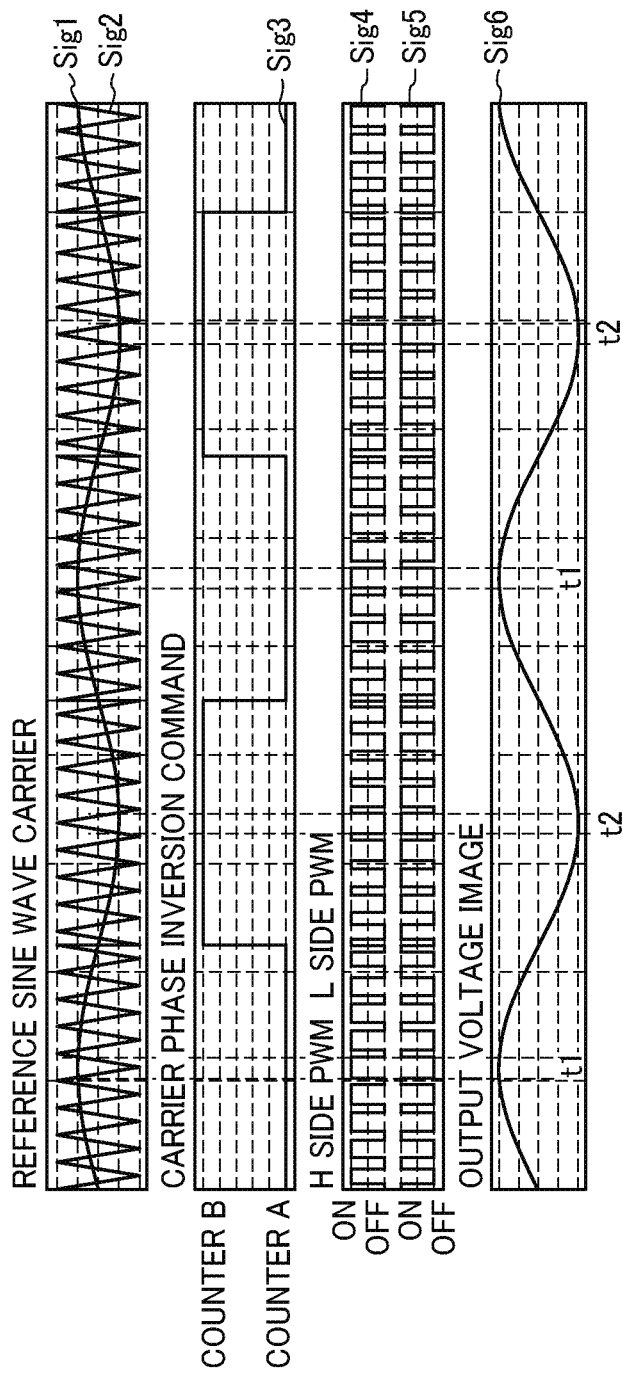
FIG. 15 is a timing chart illustrating an example of the phase relation between the carrier signal and the modulated wave when voltage distortion is eliminated in the negative peak portion by the PWM controller according to the first embodiment.

FIG. 15 is a timing chart illustrating an example of the phase relation between the carrier signal and the modulated wave when distortion is eliminated in the negative peak in the PWM controller 30B.

In FIG. 15, voltage distortion in the negative peak portion is eliminated by performing the control illustrated in FIGS. 8 and 9. In this case, the command frequency is 111 Hz, and the carrier frequency is 2000 Hz. Therefore, the multiplication number n of the carrier signal in one cycle of the modulated wave is expressed as 2000/111=18. Accordingly, the carrier number k at the phase angle of 90° is expressed as follows, $$k=18\times(90°/360°)=4.50.$$

As illustrated in FIG. 15, the switching phase at the phase angle of 90° is predicted and the switching unit 66 illustrated in FIG. 11 is operated to perform switching between the counter A 47 and the counter B 65 illustrated in FIG. 10 based on conditions illustrated in FIG. 12B. Therefore, the carrier signal can be switched according to the phase of the sine wave (Sig1), and the ON times t1 and t2 in the positive peak portion and the negative peak portion of the output sine wave (Sig6) illustrated in FIG. 15 are identical (t1=t2).

Accordingly, the surface potential of the photoconductor 6 can be kept constant, and abnormal images, which are seen in the comparative embodiment, can be prevented.

As described above, based on the carrier number k, the triangular wave carrier signal is switched to the first triangular wave carrier signal (Sig2A) or the second triangular wave carrier signal (Sig2B). The carrier number k indicates the number of carrier signals of the first triangular wave (Sig2A) generated when the phase angle of the sine wave signal (Sig1) is from 0 to π/2 rad or from 0 to 3π/2 rad. The triangular wave carrier signal is supplied to the comparator 45 in the first range of the phase angle in which the phase angle of the sine wave signal (Sig1) is from 0 to π rad, or the second range of the phase angle in which the phase angle of the sine wave signal (Sig1) is from π to 2π rad. Therefore, voltage distortion in the positive peak portion or the negative peak portion of the output sine wave (Sig6) generated by the power converter 31A can be minimized.

Second Embodiment

Figure 19:
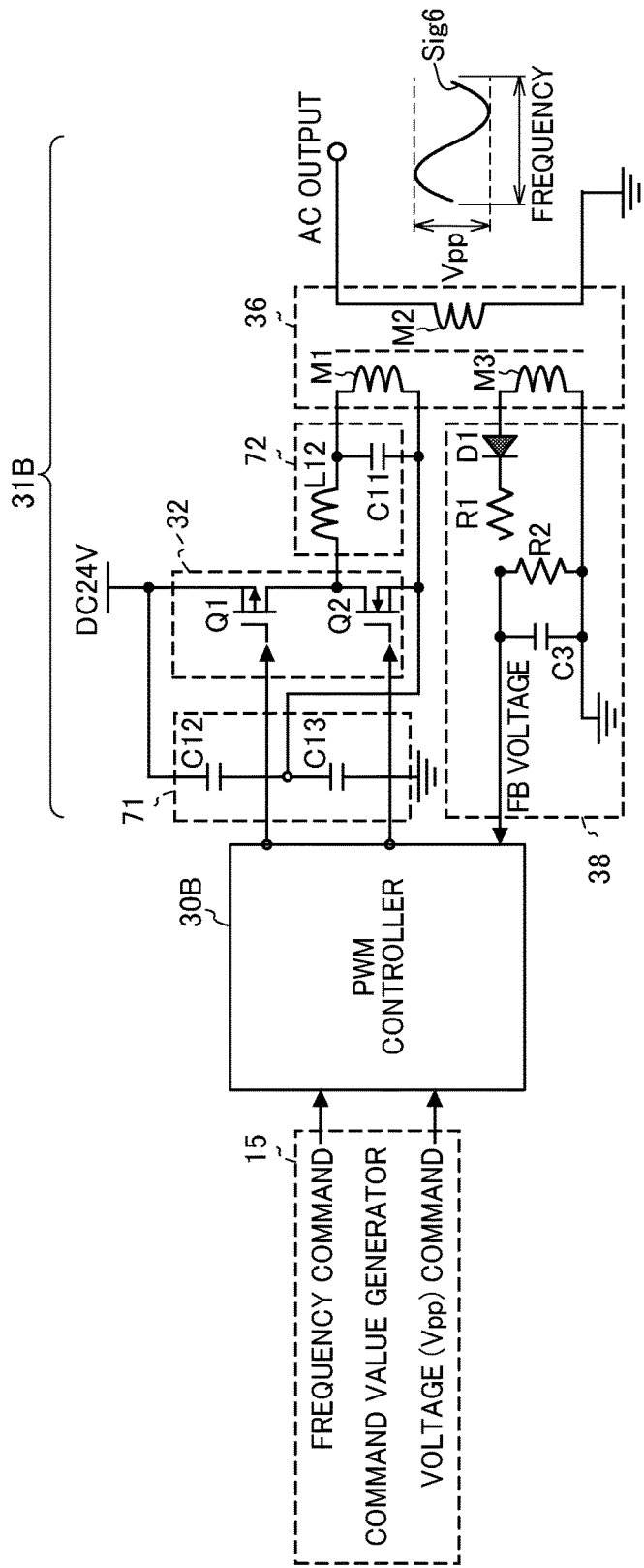
FIG. 19 is a circuit diagram of a switched-mode power supply according to a second embodiment of the present disclosure.

FIG. 19 is a circuit diagram of a high-voltage power supply for charging as a switched-mode power supply according to a second embodiment of the present disclosure.

According to the second embodiment, the power converter 31B includes a pair of capacitors C12 and C13 connected in series to both polarity terminals of the DC power supply. The pair of switching elements is a first transistor Q1 and a second transistor Q2, a source terminal of the first transistor Q1 is connected to positive polarity terminals of the DC power supply, drain terminals of the first transistor Q1 and the second transistor Q2 are connected to each other and further commonly connected to a terminal of a primary coil M1 via a low pass filter 72, and a source terminal of the second transistor Q2 are connected to a common connection midpoint between the pair of the capacitors C12 and C13, and further connected to the other terminal of the primary coil M1.

The PWM controller 30B accepts the frequency command and the voltage command from the command value generator 15 and the output current FB signal from the high-voltage power supply for charging 20, performs PWM control, and outputs the PWM signal to the power converter 31B.

The power converter 31B inputs the PWM signal supplied from the PWM controller 30B to the half bridge circuit 32, generates a midpoint potential at a connection point between the capacitors C12 and C13 of a midpoint generation capacitor 71, and generates a power pulse signal including a sinusoidal envelop according to the PWM signal in the half bridge circuit 32. Then, the power converter 31B filters the power pulse signal in a sinusoidal manner by the low pass filter 72, boosts the signal to the high voltage by the transformer 36, and outputs the sinusoidal high voltage.

The midpoint generation capacitor 71 minimizes the periodic fluctuation of the output sine wave voltage and equalizes the voltage of the positive peak portion with the voltage of the negative peak portion, thereby keeping the surface potential of the photoconductor 6 constant. Therefore, it is possible to control the DC component.

Aspect 1

A PWM controller 30B includes a sine wave calculator 42 to generate a sine wave signal according to a frequency command value fs, a counter A 47 (a first counter) to generate a first triangular wave carrier signal, and a comparator 45 to compare the sine wave signal with the first triangular wave carrier signal, generate a PWM signal, and supply the PWM signal to a power converter 31A. The PWM controller 30B further includes a counter B 65 (a second counter) to generate a second triangular wave carrier signal that is π rad behind the first triangular wave carrier signal and a carrier number calculator 61 to calculate a carrier number k based on a multiplication number n. The carrier number k indicates the number of carrier signals of the first triangular wave generated in a period in which a phase angle of the sine wave signal ranges from 0 to π/2 rad or from 0 to 3π/2 rad, and the multiplication number n indicates a ratio of a frequency fc of the first triangular wave carrier signal to the frequency command value fs. The PWM controller 30B yet further includes a carrier control unit 62 to switch a triangular wave carrier signal to the first triangular wave carrier signal or the second triangular wave carrier signal based on the carrier number k, to supply the triangular wave carrier signal to the comparator 45 in a first range of the phase angle ranging from 0 to π rad or a second range of the phase angle ranging from π to 2π rad.

According to Aspect 1, based on the carrier number k, the triangular wave carrier signal is switched to the first triangular wave carrier signal or the second triangular wave carrier signal. The triangular wave carrier signal is supplied to the comparator 45 in the first range of the phase angle in which the phase angle of the sine wave signal is from 0 to π rad, or the second range of the phase angle in which the phase angle of the sine wave signal is from π to 2π rad. Therefore, a voltage distortion (a waveform distortion) in the positive peak portion or the negative peak portion of the output sine wave generated by the power converter 31A can be minimized.

Aspect 2

According to Aspect 2, the carrier control unit 62 includes a selection command generator 63 to generate at least one of a first selection command and a second selection command to avoid voltage distortion in the positive peak portion or the negative peak portion of the sine wave voltage generated by the power converter 31A according to a phase of the PWM signal. The first selection command specifies the triangular wave carrier signal supplied to the comparator 45 in the first range of the phase angle, and the second selection command specifies the triangular wave carrier signal supplied to the comparator 45 in the second range of the phase angle. The carrier control unit 62 further includes a phase control unit 64 to generate a selection signal according to the first selection command when the phase angle of the sine wave signal is within the first range of the phase angle and to generate a selection signal according to the second selection command when the phase angle of the sine wave signal is within the second range of the phase angle.

According to Aspect 2, the selection command generator 63 generates at least one of the first selection command and the second selection command to avoid voltage distortion in the positive peak portion or the negative peak portion of the sine wave voltage generated by the power converter 31A according to the phase of the PWM signal. The phase control unit 64 generates the selection signal according to the first selection command when the phase angle of the sine wave signal is within the first range of the phase angle and to generate the selection signal according to the second selection command when the phase angle of the sine wave signal is within the second range of the phase angle. Therefore, voltage distortion can be prevented in the positive peak portion or the negative peak portion of the sine wave voltage generated by the power converter 31A according to the phase of the PWM signal.

Aspect 3

According to Aspect 3, the selection command generator 63 includes a prediction unit 63a to predict whether voltage distortion exists in the positive peak portion or the negative peak portion of the sine wave voltage generated by the power converter 31A according to the phase of the PWM signal based on the carrier number k. In a case in which the prediction unit 63a predicts that voltage distortion exists in the positive peak portion or the negative peak portion, the selection command generator 63 generates the first selection command or the second selection command so that voltage distortion in the positive peak portion or the negative peak portion of the sine wave voltage, which is generated by the power converter 31A according the phase of the PWM signal, is not generated.

According to Aspect 3, in a case in which the prediction unit 63a predicts that voltage distortion exists in the positive peak portion or the negative peak portion, the selection command generator 63 generates the first selection command or the second selection command so that voltage distortion in the positive peak portion or the negative peak portion of the sine wave voltage, which is generated by the power converter 31A according the phase of the PWM signal, is not generated. Therefore, voltage distortion can be prevented.

Aspect 4

According to Aspect 4, in a case in which a first decimal place of the carrier number k is 0, the prediction unit 63a predicts that voltage distortion exists in the positive peak of the sine wave voltage generated by the power converter 31A according the phase of the PWM signal. In a case in which a first decimal place of the carrier number k is 5, the prediction unit 63a predicts that voltage distortion exists in the negative peak portion of the sine wave voltage generated by the power converter 31A according the phase of the PWM signal.

According to Aspect 4, the prediction unit 63a can predict whether voltage distortion exists in the positive peak portion or the negative peak portion of the sine wave voltage generated by the power converter 31A based on the carrier number k.

Aspect 5

According to Aspect 5, when the prediction unit 63a predicts that voltage distortion exists in the positive peak portion, the selection command generator 63 generates the second selection command to supply the second triangular wave carrier signal to the comparator 45 in the first range of the phase angle and the first selection command to supply the first triangular wave carrier signal to the comparator 45 in the second range of the phase angle.

Therefore, voltage distortion can be minimized in the positive peak portion of the sine wave voltage generated by the power converter 31A.

Aspect 6

According to Aspect 6, when the prediction unit 63a predicts that voltage distortion exists in the negative peak portion, the selection command generator 63 generates the first selection command to supply the first triangular wave carrier signal to the comparator 45 in the first range of the phase angle and the second selection command to supply the second triangular wave carrier signal to the comparator 45 in the second range of the phase angle.

Therefore, voltage distortion can be minimized in the negative peak portion of the sine wave voltage generated by the power converter 31A.

Aspect 7

According to Aspect 7, the carrier number calculator 61 calculates multiplication number n that is an integer obtained by dividing the frequency fc of the first triangular wave carrier signal by the frequency command value fs.

Therefore, the CPU 30Aa can generate the carrier signal fc of the first triangular wave that is a value obtained by multiplying the frequency command value fs by the multiplication number n.

Aspect 8

According to Aspect 8, the PWM controller 30B includes the synchronization control unit 41 that calculates the multiplication number n. The multiplication number n is obtained by dividing the frequency fc of the first triangular wave carrier signal by the frequency command value fs based on the frequency command value fs input from the command value generator 15 and the carrier signal fc of the first triangular wave input from the counter A 47 (the first counter). Then, the synchronization control unit 41 calculates the angular speed w from the multiplication number n, and supplies the angular speed w to the sine wave calculator 42, thereby synchronizing the first triangular wave carrier signal and the sine wave signal.

Therefore, it is possible to synchronize the first triangular wave carrier signal and the sine wave signal.

Aspect 9

A switched-mode power supply includes the PWM controller 30B according to Aspect 1 and the power converter 31 to accept the PWM signal from the PWM controller 30B.

Therefore, voltage distortion can be minimized in the positive peak portion or the negative peak portion of the sine wave voltage generated by the power converter 31.

Aspect 10

According to Aspect 10, the power converter 31 includes a pair of switching elements Q1 and Q2 connected to a DC power supply to turn on and off alternately according to the PWM signal generated by the PWM controller 30B and a transformer 36 including a primary coil M1 to transform electric power to magnetic energy and a secondary coil M2. The electric power is supplied from the DC power supply by the pair of switching elements Q1 and Q2 turning on and off alternately. The secondary coil M2 is coupled to the primary coil M1 magnetically to induce magnetic energy.

Therefore, the output sine wave can be generated in which voltage distortion in the positive peak portion or the negative peak portion is minimized.

Aspect 11

According to Aspect 11, the power converter 31A illustrated in FIG. 3 includes a filter circuit 34 between the pair of switching elements Q1 and Q2 and the primary coil M1 of a transformer 36. The filter circuit 34 includes a capacitor C2 for removing a DC component.

Therefore, the filter circuit 34 including the capacitor C2 for removing DC component can minimize the periodic fluctuation of the output sine wave voltage and equalize the voltage of the positive peak portion with the voltage of the negative peak portion. As a result, it is possible to remove the DC component of the output sine wave voltage output from the power converter 31A.

Aspect 12

According to Aspect 12, the power converter 31B illustrated in FIG. 19 includes a pair of capacitors C12 and C13 connected in series to both polarity terminals of the DC power supply. The pair of switching elements is a first transistor Q1 and a second transistor Q2. A source terminal of the first transistor Q1 is connected to positive polarity terminal of the DC power supply, drain terminals of the first transistor Q1 and the second transistor Q2 are commonly connected to each other and further connected to a terminal of the primary coil M1 via a low pass filter 72, and a source terminal of the second transistor Q2 is connected to a common connection midpoint between the pair of capacitor C12 and C13 and further connected to the other terminal of the primary coil M1.

Therefore, since the source terminal of the second transistor Q2 is connected to the common connection midpoint between the pair of capacitor C12 and C13, and further connected to the other terminal of the primary coil M1, it is possible to minimize the periodic fluctuation of the output sine wave voltage and equalize the voltage of the positive peak portion with the voltage of the negative peak portion. As a result, it is possible to control the DC component output from the power converter 31B.

Aspect 13

According to Aspect 13, an image forming apparatus 1 includes the switched-mode power supply according to Aspect 10, a charging roller 11 (a charger) coupled to the secondary coil M2 of the transformer 36, and a photoconductor 6 disposed opposite the charging roller 11 (the charger).

Therefore, the output sine wave voltage can be generated in which voltage distortion in the positive peak portion or the negative peak portion is minimized and applied to the photoconductor 6 via the charging roller 11. As a result, the stable sine wave voltage can keep the surface potential of the photoconductor 6 constant.

Aspect 14

According to Aspect 14, a method for performing PWM control includes generating a sine wave signal according to a frequency command value fs, generating a first triangular wave carrier signal, comparing the sine wave signal with the first triangular wave carrier signal, generating a PWM signal, and supplying the PWM signal to a power converter 31. The method further includes generating a second triangular wave carrier signal that is n rad behind the first triangular wave carrier signal and calculating a carrier number k based on a multiplication number n. The carrier number k indicates the number of carrier signals of the first triangular wave generated in a period in which a phase angle of the sine wave signal ranges from 0 to $\pi/2$ rad or from 0 to $3\pi/2$ rad, and the multiplication number n indicates a ratio of a frequency fc of the first triangular wave carrier signal to the frequency command value fs. The method yet further includes switching a triangular wave carrier signal to the first triangular wave carrier signal or the second triangular wave carrier signal based on the carrier number k, to supply the triangular wave carrier signal to the comparator in a first range of the phase angle ranging from 0 to $\pi$ rad or a second range of the phase angle ranging from $\pi$ to $2\pi$ rad.

The operation and effect according to Aspect 14 are the same or substantially the same as those of the Aspect 1. Therefore, redundant description is omitted below.

Aspect 15

According to Aspect 15, a non-transitory recording medium storing a program which, when executed by one or more processors, cause the one or more processors to perform a method. The method includes generating a sine wave signal according to a frequency command value fs, generating a first triangular wave carrier signal, comparing the sine wave signal with the first triangular wave carrier signal, generating a PWM signal, and supplying the PWM signal to a power converter 31. The method further includes generating a second triangular wave carrier signal that is $\pi$ rad behind the first triangular wave carrier signal and calculating a carrier number k based on a multiplication number n. The carrier number k indicates the number of carrier signals of the first triangular wave generated in a period in which a phase angle of the sine wave signal ranges from 0 to π/2 rad or from 0 to 3π/2 rad, and the multiplication number n indicates a ratio of a frequency fc of the first triangular wave carrier signal to the frequency command value fs. The method yet further includes switching a triangular wave carrier signal to the first triangular wave carrier signal or the second triangular wave carrier signal based on the carrier number k, to supply the triangular wave carrier signal to the comparator in a first range of the phase angle ranging from 0 to π rad or a second range of the phase angle ranging from π to 2π rad.

Therefore, the processor can perform the method.

The above-described embodiments are illustrative and do not limit the present disclosure. Thus, numerous additional modifications and variations are possible in light of the above teachings. For example, elements and/or features of different illustrative embodiments may be combined with each other and/or substituted for each other within the scope of the present disclosure.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA), and conventional circuit components arranged to perform the recited functions.

What is claimed is:

1. A pulse width modulation (PWM) controller comprising:
   a non-transitory recording medium storing one or more programs; and
   a processor configured to execute the one or more programs to
      generate a sine wave signal according to a frequency command value;
      generate a first triangular wave carrier signal;
      compare the sine wave signal with the first triangular wave carrier signal, generate a PWM signal, and supply the PWM signal to a power converter;
      generate a second triangular wave carrier signal that is π rad behind the first triangular wave carrier signal;
      calculate a carrier number based on a multiplication number, the carrier number indicating a number of carrier signals of the first triangular wave carrier signal generated in a period in which a phase angle of the sine wave signal ranges from 0 to π/2 rad or from 0 to 3π/2 rad, the multiplication number indicating a ratio of a frequency of the first triangular wave carrier signal to the frequency command value; and
      switch a triangular wave carrier signal to the first triangular wave carrier signal or the second triangular wave carrier signal based on the carrier number, to supply the triangular wave carrier signal in a first range of the phase angle ranging from 0 to π rad or a second range of the phase angle ranging from π to 2π rad.

2. The PWM controller according to claim 1, wherein the processor is further configured to execute the one or more programs to
   generate at least one of a first selection command and a second selection command to avoid voltage distortion in a positive peak portion or a negative peak portion of a sine wave voltage generated by the power converter according to a phase of the PWM signal, wherein the first selection command specifies the triangular wave carrier signal supplied in the first range of the phase angle, and the second selection command specifies the triangular wave carrier signal supplied in the second range of the phase angle; and
   generate a selection signal according to the first selection command when the phase angle of the sine wave signal is within the first range of the phase angle and to generate a selection signal according to the second selection command when the phase angle of the sine wave signal is within the second range of the phase angle.

3. The PWM controller according to claim 2, wherein the processor is further configured to execute the one or more programs to
   predict whether voltage distortion exists in the positive peak portion or the negative peak portion of the sine wave voltage generated by the power converter according to the phase of the PWM signal, based on the carrier number, and
   generate the first selection command or the second selection command to avoid voltage distortion, based on a determination that voltage distortion is predicted to exist in the positive peak portion or the negative peak portion.

4. The PWM controller according to claim 3, wherein the processor is further configured to execute the one or more programs to
   predict that voltage distortion exists in the positive peak portion of the sine wave voltage generated by the power converter according to the phase of the PWM signal in a case in which a first decimal place of the carrier number is 0 and that voltage distortion exists in the negative peak portion of the sine wave voltage generated by the power converter according the phase of the PWM signal in a case in which a first decimal place of the carrier number is 5.

5. The PWM controller according to claim 3, wherein the processor is further configured to execute the one or more programs to
   generate the second selection command to supply the second triangular wave carrier signal in the first range of the phase angle and the first selection command to supply the first triangular wave carrier signal in the second range of the phase angle, based on a determination that voltage distortion is predicted to exist in the positive peak portion.

6. The PWM controller according to claim 3, wherein the processor is further configured to execute the one or more programs to
   generate the first selection command to supply the first triangular wave carrier signal in the first range of the phase angle and the second selection command to supply the second triangular wave carrier signal in the second range of the phase angle based on a determination that voltage distortion is predicted to exist in the negative peak portion.

7. The PWM controller according to claim 1, wherein the processor is further configured to execute the one or more programs to
   calculate the multiplication number that is an integer obtained by dividing the frequency of the first triangular wave carrier signal by the frequency command value.

8. The PWM controller according to claim 1, wherein the processor is further configured to execute the one or more programs to
calculate the multiplication number that is an integer obtained by dividing the frequency of the first triangular wave carrier signal by the frequency command value, calculate an angular speed based on the carrier number, and supply the angular speed to synchronize the first triangular wave carrier signal and the sine wave signal.

9. A switched-mode power supply comprising:
the PWM controller according to claim 1; and
the power converter configured to accept the PWM signal from the PWM controller.

10. The switched-mode power supply according to claim 9, wherein the power converter include:
a pair of switching elements connected to a direct current (DC) power supply, the pair of switching element configured to turn on and off alternately according to the PWM signal generated by the PWM controller; and
a transformer including:
a primary coil configured to transform electric power to magnetic energy, the electric power supplied from the DC power supply by the pair of switching elements turning on and off alternately; and
a secondary coil coupled to the primary coil magnetically to induce magnetic energy.

11. The switched-mode power supply according to claim 10, further comprising:
a filter circuit including a capacitor, the capacitor configured to eliminate a DC component between the pair of switching elements and the primary coil of the transformer.

12. The switched-mode power supply according to claim 10, further comprising:
a pair of capacitors connected in series to both polarity terminals of the DC power supply,
wherein the pair of switching elements includes a first transistor and a second transistor, a source terminal of the first transistor is connected to a positive polarity terminal of the DC power supply, drain terminals of the first transistor and the second transistor are commonly connected to one terminal of the primary coil via a low pass filter, and a source terminal of the second transistor is connected to a common connection midpoint between the pair of capacitors and further connected to a terminal of the primary coil other than the one terminal of the primary coil.

13. An image forming apparatus comprising:
the switched-mode power supply according to claim 10;
a charger coupled to the secondary coil of the transformer; and
a photoconductor disposed opposite the charger.

14. A method for performing pulse width modulation (PWM) control, the method comprising:
generating a sine wave signal according to a frequency command value;
generating a first triangular wave carrier signal;
comparing the sine wave signal with the first triangular wave carrier signal, generating a PWM signal, and supplying the PWM signal to a power converter;
generating a second triangular wave carrier signal that is $\pi$ rad behind the first triangular wave carrier signal;
calculating a carrier number based on a multiplication number, the carrier number indicating a number of carrier signals of the first triangular wave carrier signal generated in a period in which a phase angle of the sine wave signal ranges from 0 to $\pi/2$ rad or from 0 to $3\pi/2$ rad, the multiplication number indicating a ratio of a frequency of the first triangular wave carrier signal to the frequency command value; and
switching a triangular wave carrier signal to the first triangular wave carrier signal or the second triangular wave carrier signal based on the carrier number, to supply the triangular wave carrier signal the comparator in a first range of the phase angle ranging from 0 to $\pi$ rad or a second range of the phase angle ranging from $\pi$ to $2\pi$ rad.

15. The method according to claim 14, further comprising:
generating at least one of a first selection command and a second selection command to avoid voltage distortion in a positive peak portion or a negative peak portion of a sine wave voltage generated by the power converter according to a phase of the PWM signal, wherein the first selection command specifies the triangular wave carrier signal supplied in the first range of the phase angle, and the second selection command specifies the triangular wave carrier signal supplied in the second range of the phase angle; and
generating a selection signal according to the first selection command when the phase angle of the sine wave signal is within the first range of the phase angle and to generate a selection signal according to the second selection command when the phase angle of the sine wave signal is within the second range of the phase angle.

16. The method according to claim 14, further comprising:
calculating the multiplication number that is an integer obtained by dividing the frequency of the first triangular wave carrier signal by the frequency command value.

17. The method according to claim 14, further comprising:
calculating the multiplication number that is an integer obtained by dividing the frequency of the first triangular wave carrier signal by the frequency command value, calculate an angular speed based on the carrier number, and supply the angular speed to synchronize the first triangular wave carrier signal and the sine wave signal.

18. A non-transitory recording medium storing a program which, when executed by one or more processors, cause the one or more processors to perform a method comprising:
generating a sine wave signal according to a frequency command value;
generating a first triangular wave carrier signal;
comparing the sine wave signal with the first triangular wave carrier signal, generating a pulse width modulation (PWM) signal, and supplying the PWM signal to a power converter;
generating a second triangular wave carrier signal that is $\pi$ rad behind the first triangular wave carrier signal;
calculating a carrier number based on a multiplication number, the carrier number indicating a number of carrier signals of the first triangular wave carrier signal generated in a period in which a phase angle of the sine wave signal ranges from 0 to $\pi/2$ rad or from 0 to $3\pi/2$ rad, the multiplication number indicating a ratio of a frequency of the first triangular wave carrier signal to the frequency command value; and
switching a triangular wave carrier signal to the first triangular wave carrier signal or the second triangular wave carrier signal based on the carrier number, to supply the triangular wave carrier signal the comparator in a first range of the phase angle ranging from 0 to π rad or a second range of the phase angle ranging from π to 2π rad.

19. The non-transitory recording medium according to claim 18, wherein the method further includes generating at least one of a first selection command and a second selection command to avoid voltage distortion in a positive peak portion or a negative peak portion of a sine wave voltage generated by the power converter according to a phase of the PWM signal, wherein the first selection command specifies the triangular wave carrier signal supplied in the first range of the phase angle, and the second selection command specifies the triangular wave carrier signal supplied in the second range of the phase angle; and generating a selection signal according to the first selection command when the phase angle of the sine wave signal is within the first range of the phase angle and to generate a selection signal according to the second selection command when the phase angle of the sine wave signal is within the second range of the phase angle.

20. The non-transitory recording medium according to claim 18, wherein the method further includes calculating the multiplication number that is an integer obtained by dividing the frequency of the first triangular wave carrier signal by the frequency command value.

* * * * *